United States Patent [19]
Burleson et al.

[11] Patent Number: 4,626,825
[45] Date of Patent: Dec. 2, 1986

[54] LOGARITHMIC CONVERSION APPARATUS

[75] Inventors: Wayne P. Burleson, Palo Alto; Lawrence F. Wagner, Berkeley; Korbin S. Van Dyke, Fremont, all of Calif.

[73] Assignee: VLSI Technology, Inc., San Jose, Calif.

[21] Appl. No.: 751,305

[22] Filed: Jul. 2, 1985

[51] Int. Cl.[4] .............................................. H03M 7/50
[52] U.S. Cl. ............................................ 340/347 DD
[58] Field of Search .................. 364/715; 340/347 DD

[56] References Cited

U.S. PATENT DOCUMENTS
4,078,250  3/1978  Windsor ............................ 364/715

OTHER PUBLICATIONS

Earl E. Swartzlander, Jr. et al., "Sign/Logarithm Arithmetic for FFT Implementation", IEEE, vol. C-32, No. 6, Jun. 1983, pp. 526-534.
N. G. Kingsbury et al., "Digital Filtering Using Logarithmic Arithmetic", Electron. Lett., 7:56-58 (1971), pp. 215-217.
Thomas A. Brubaker, "Multiplication Using Logarithms Implemented with Read-Only Memory", IEEE, vol. C-24, No. 8, Aug. 1975, pp. 761-765.
Fred J. Taylor, "An Extended Precision Logarithmic Number System", IEEE, vol. ASSP.31, No. 1, Feb. 1983, pp. 232-233.
Earl E. Swartzlander, Jr. et al., "The Sign/Logarithm Number System", IEEE, Dec. 1975, pp. 1238-1242.
Andreas Bechtolsheim et al., "The Implementation of Logarithmic Arithmetic".
Tomio Kurokawa et al., "Error Analysis of Recursive Digital Filters Implemented with Logarithmic Number Systems", IEEE, vol. Assp-28, No. 6, Dec. 1980, pp. 706-715.
Albert D. Edgar et al., "Focus Microcomputer Number System", Communications of the ACM, vol. 22, No. 3, Mar. 1979, pp. 166-177.
Samuel C. Lee et al., "The Focus Number System", IEEE, vol. C-26, No. 11, Nov. 1977, pp. 1167-1170.

Primary Examiner—Charles D. Miller
Attorney, Agent, or Firm—Limbach, Limbach & Sutton

[57] ABSTRACT

A logarithmic converting apparatus for converting a digital binary integer into logarithmic representation and for converting logarithmic representation into digital binary integer is disclosed. The apparatus determines the bit position of a leading non-zero bit of an integer, shifts the integer such that the leading non-zero bit is the leftmost bit. A look-up table receives the shifted integer and provides a number representative of the mantissa portion of the logarithm of the shifted number. An encoder receives a Point Set Input value, a scale value for said integer, and the number of binary positions shifted and generates the exponential portion of the logarithm of the integer. For converting logarithmic representation of a number into integer representation, the apparatus has a look-up table which receives the mantissa component of the logarithmic representation and provides a first number. A decoder receives the exponential component of the logarithmic representation and a Point Set Output value, a scale value for said integer, and supplies a shifted signal. The shifted signal is supplied to a shifter along with the first number and the shifter shifts the first number by the shift signal to produce the integer.

1 Claim, 23 Drawing Figures

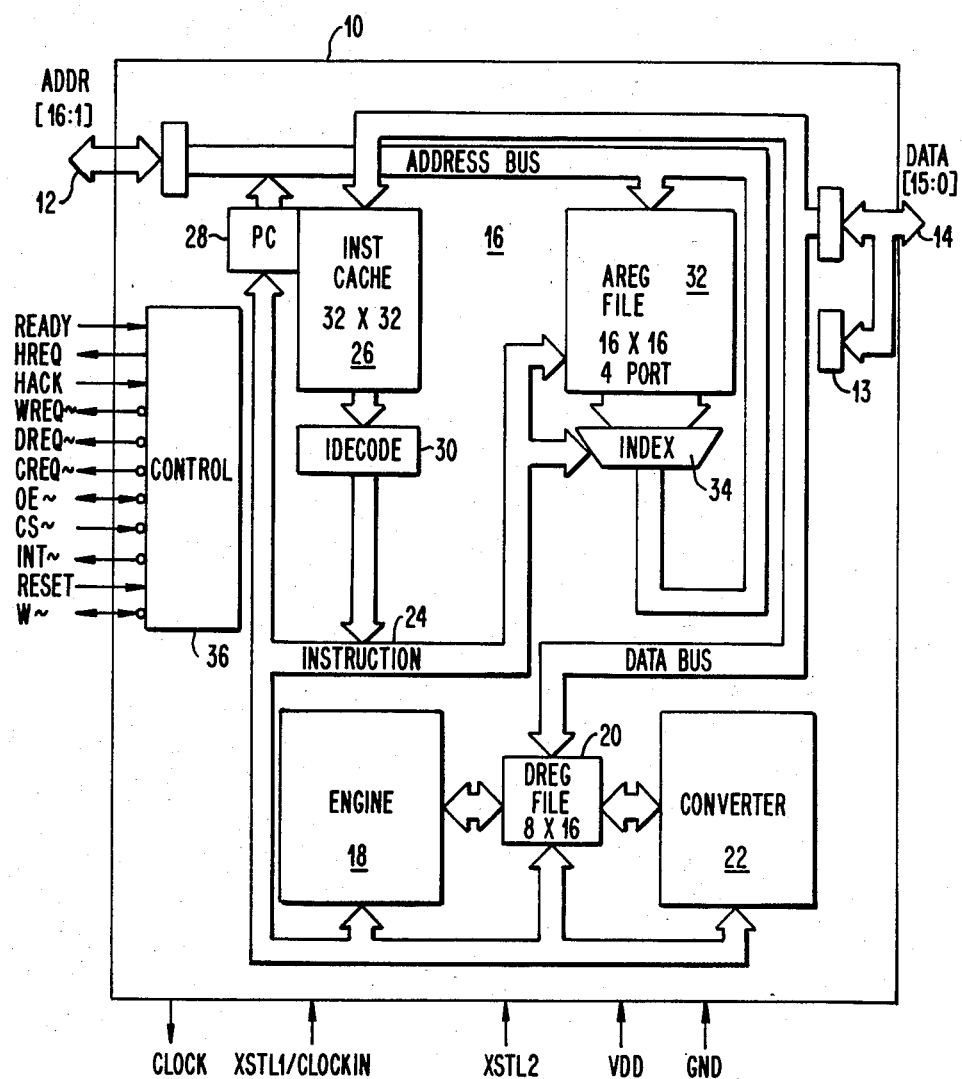
FIG._1.

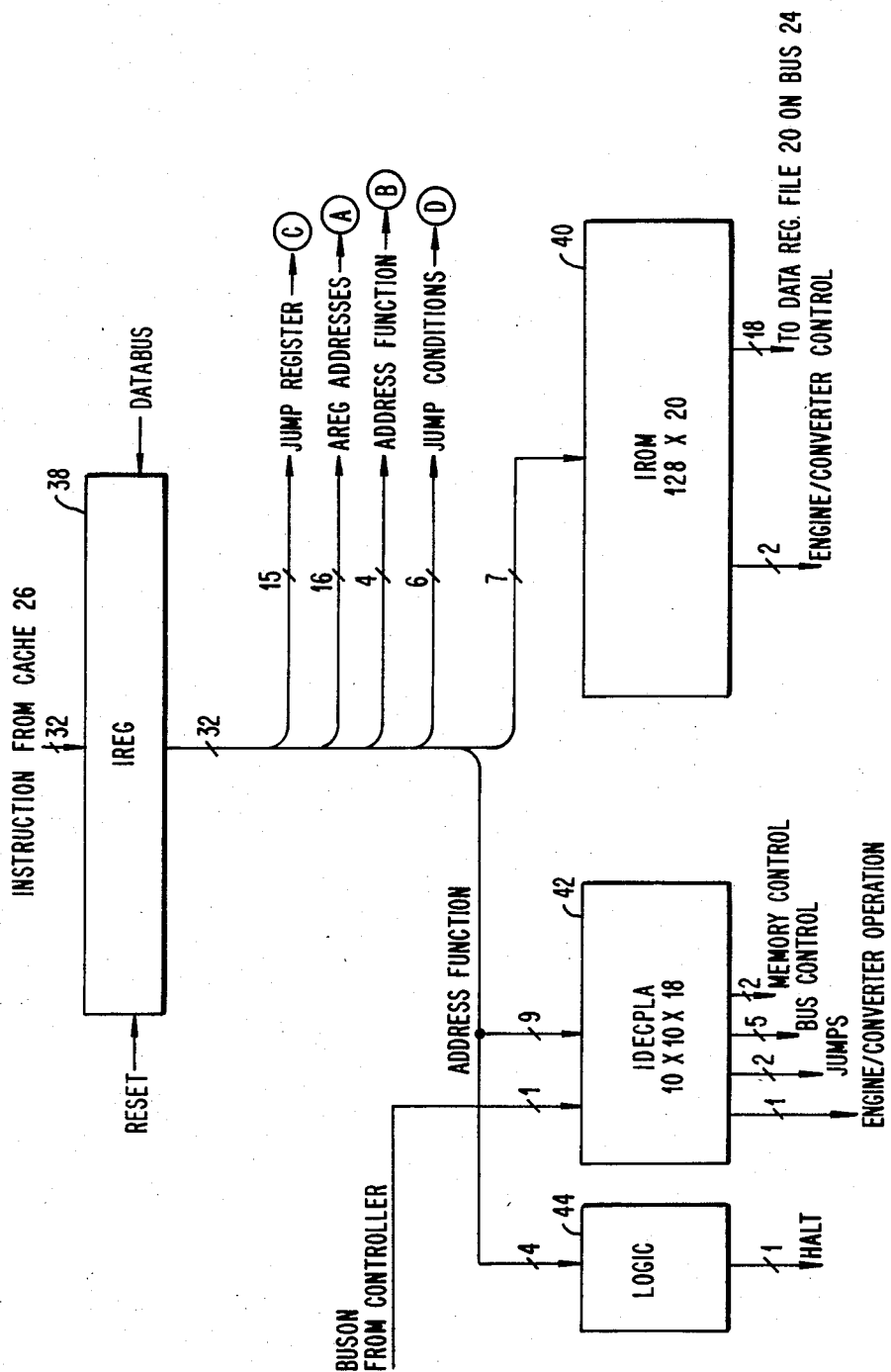
FIG.—1a.

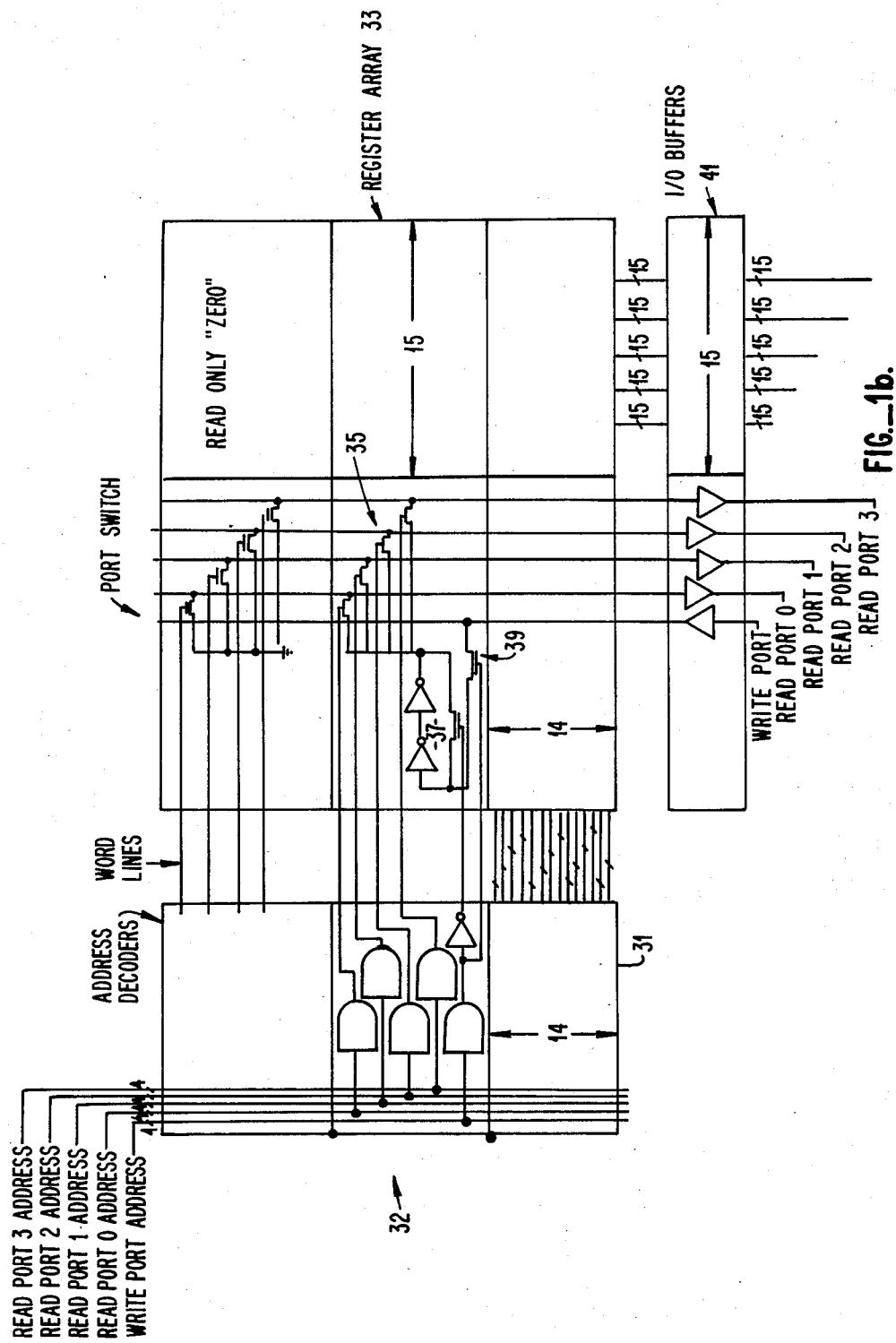
FIG._1b.

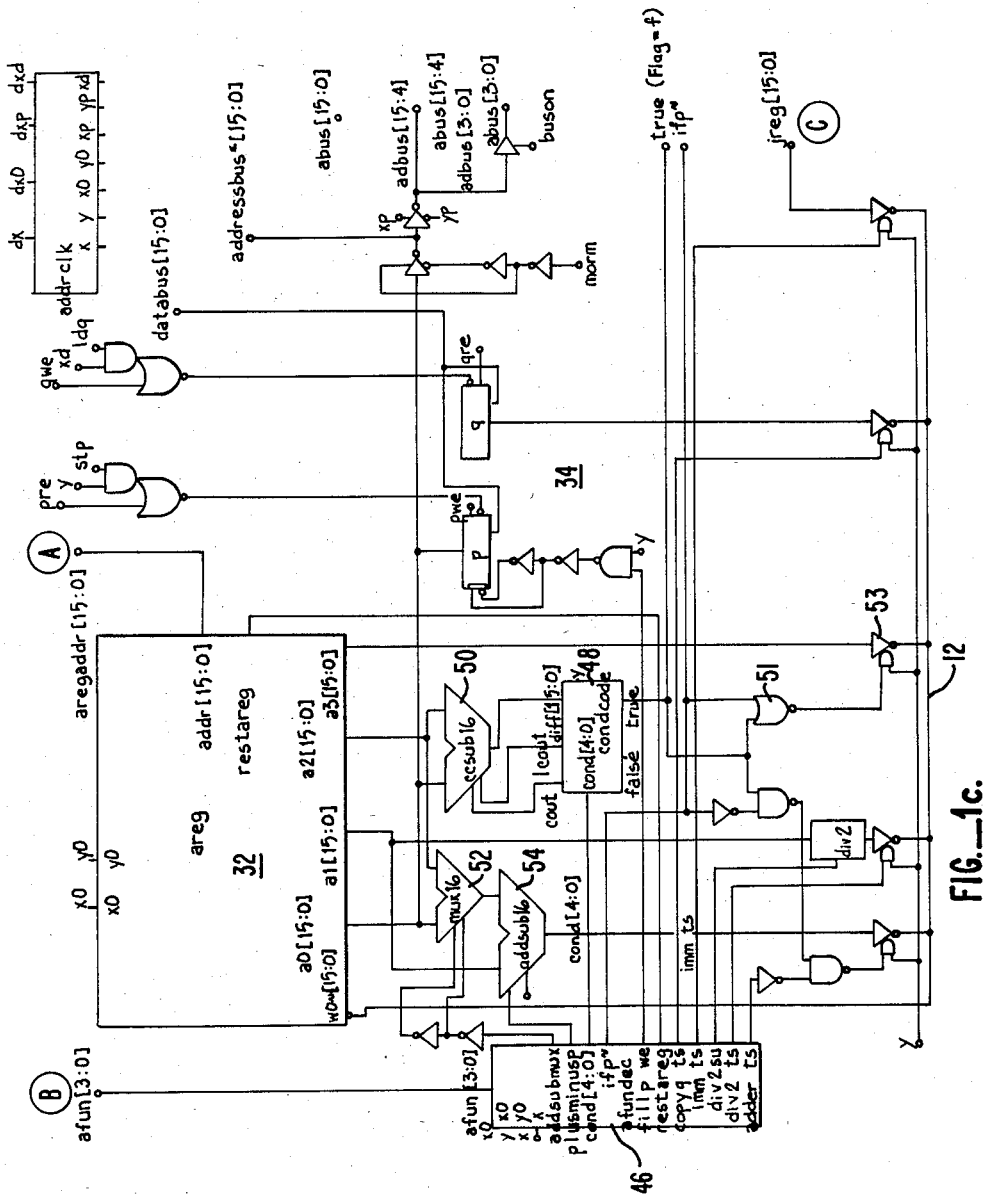
FIG._1c.

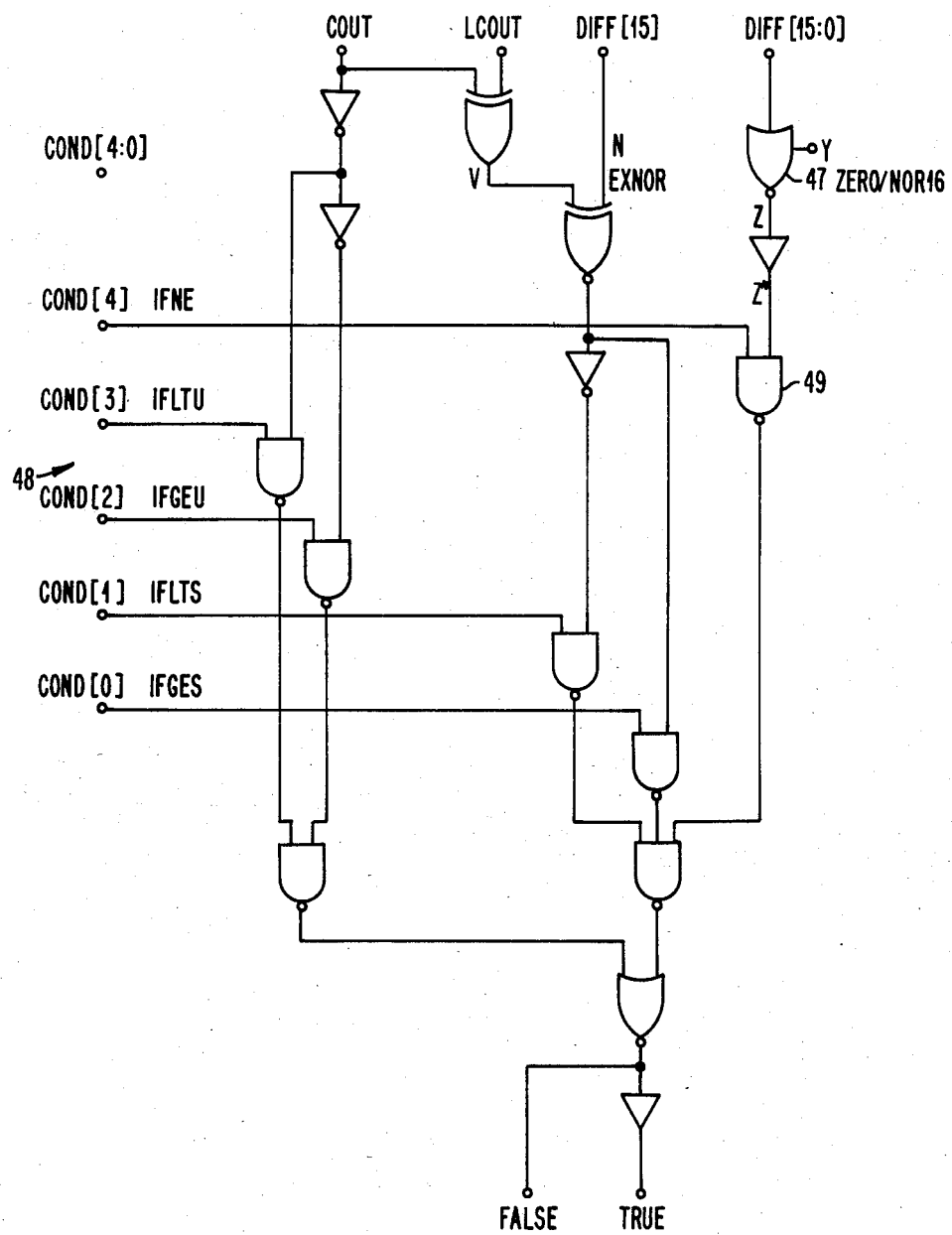
FIG._1d.

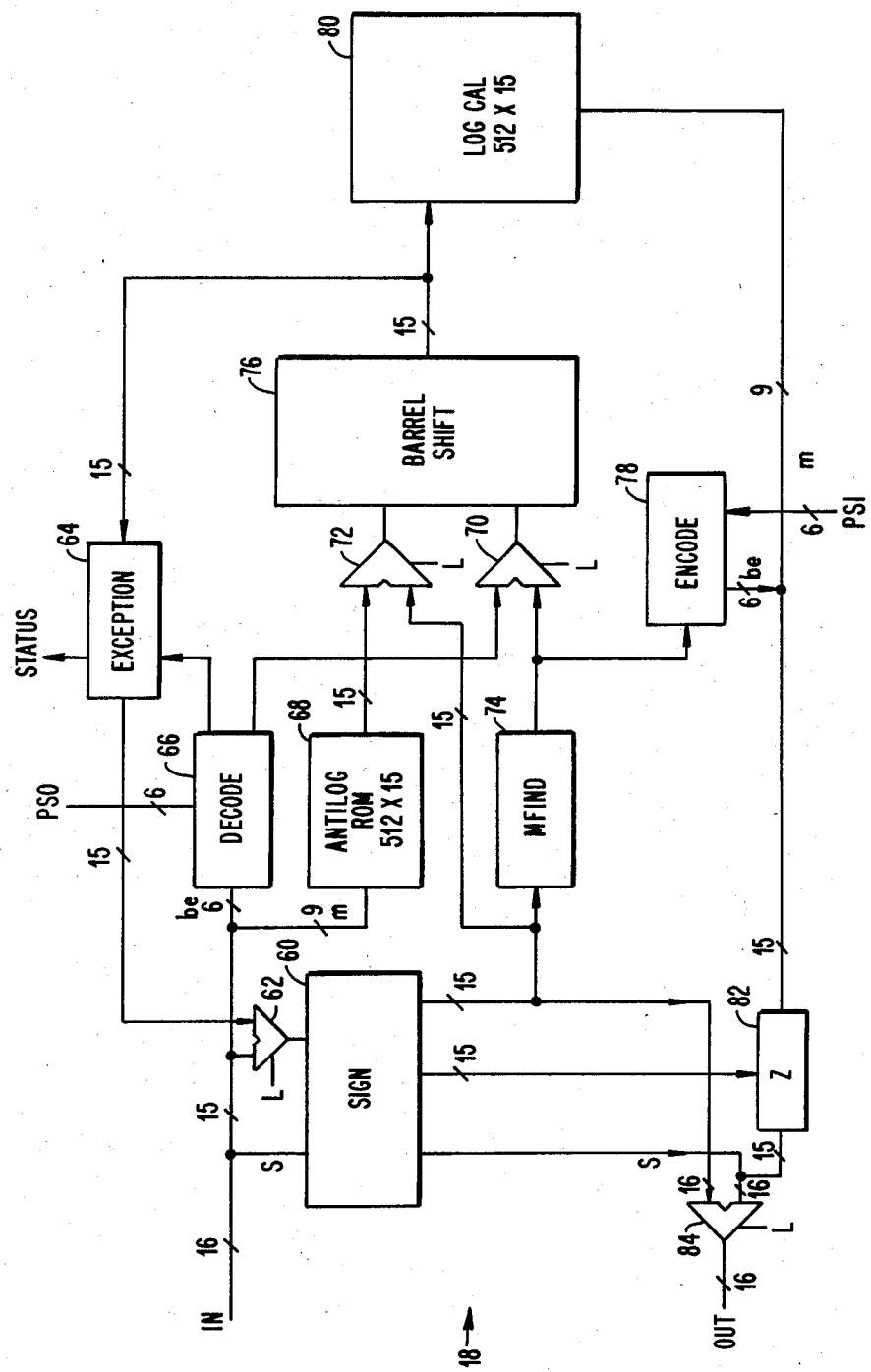
FIG._2.

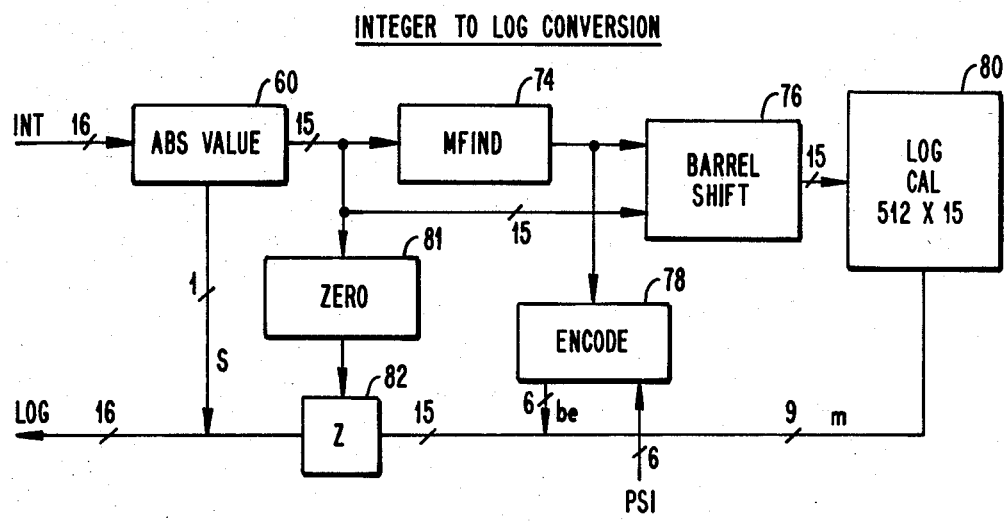
FIG._2a.
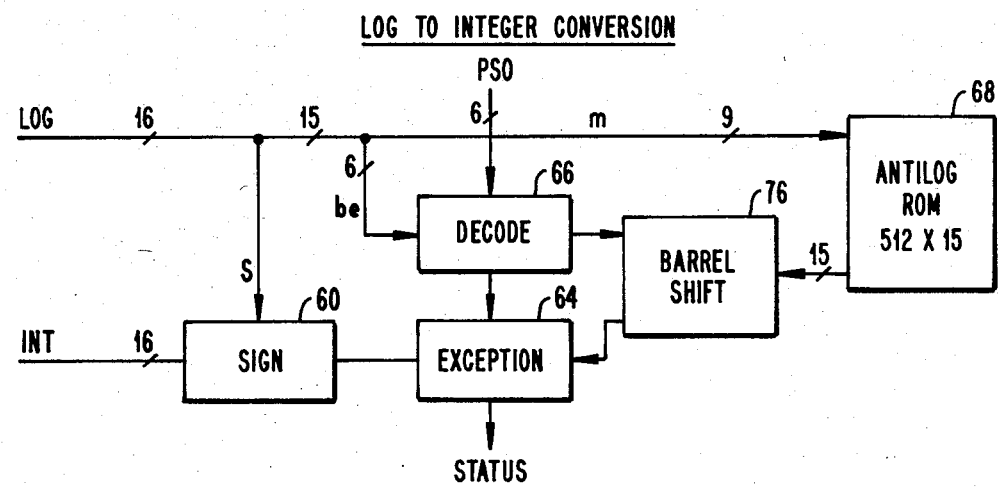
FIG._2b.

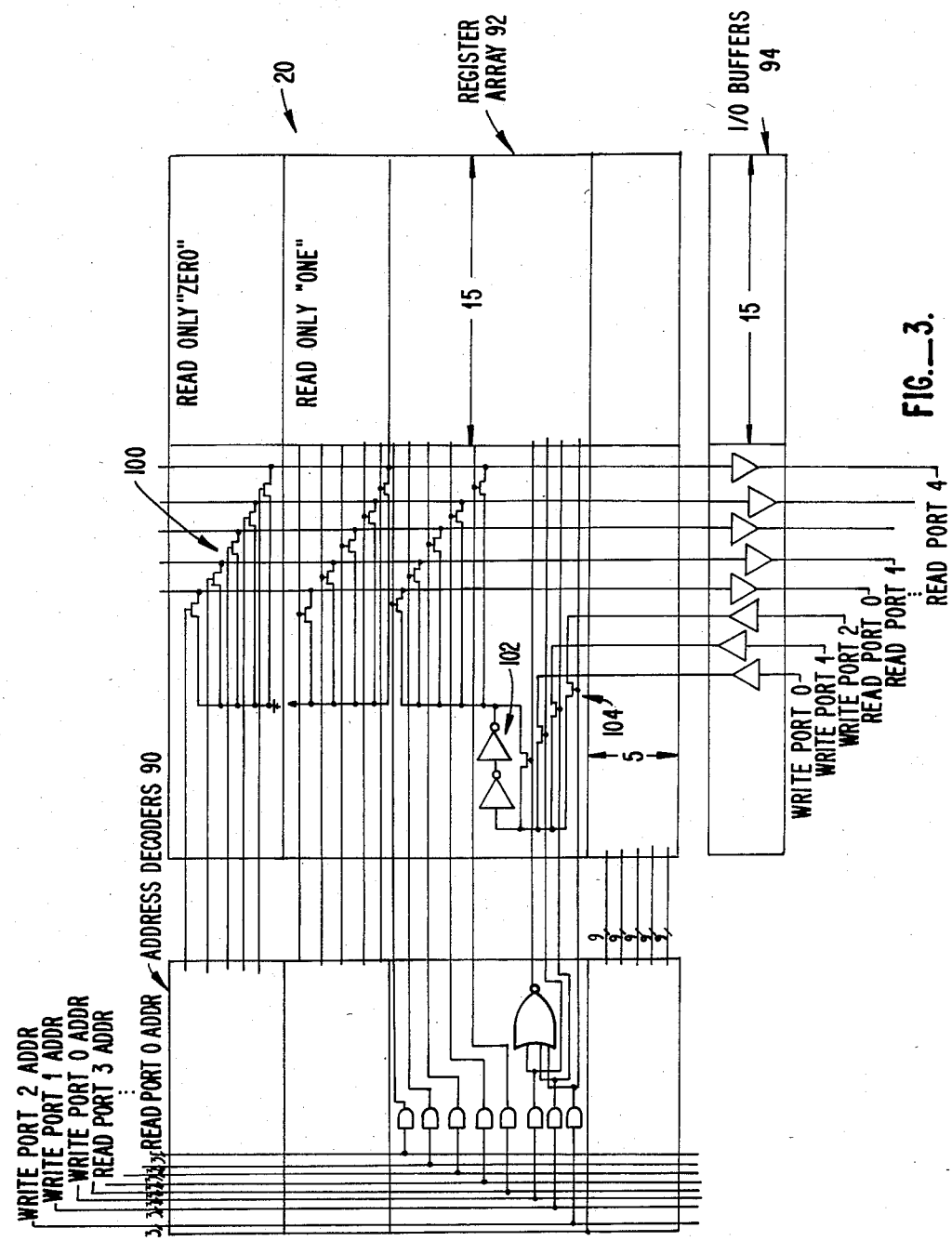
FIG.—3.

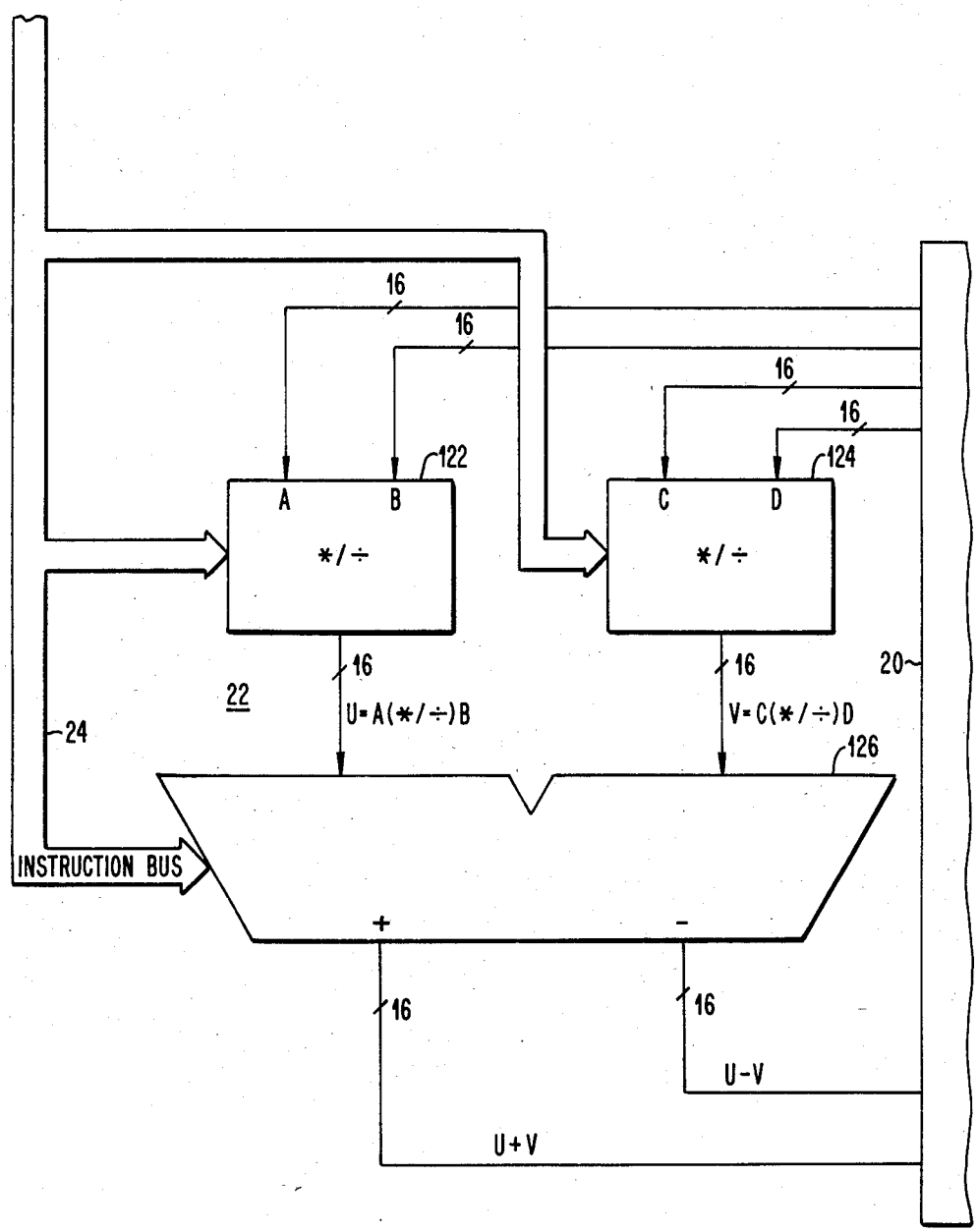
FIG._4.

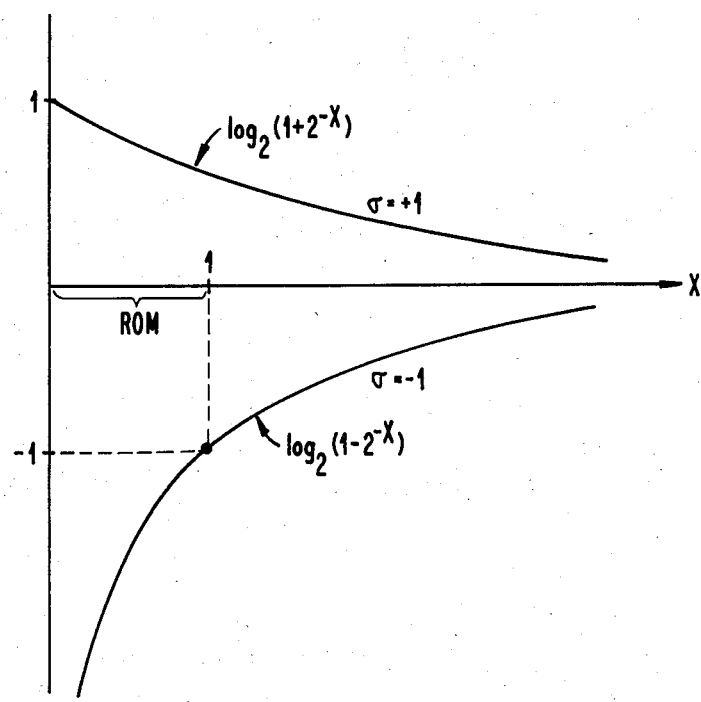
FIG._4a.

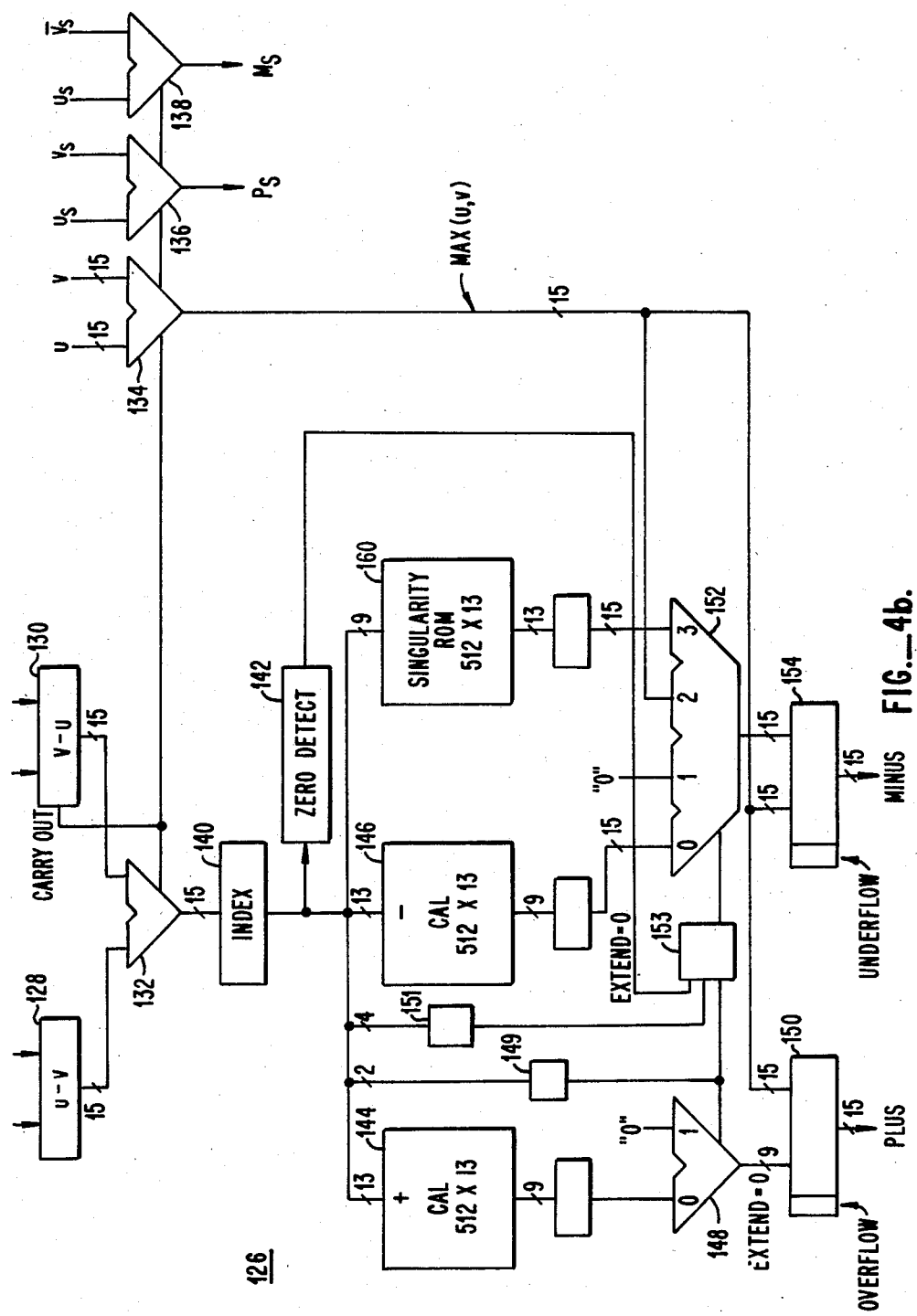
FIG._4b.

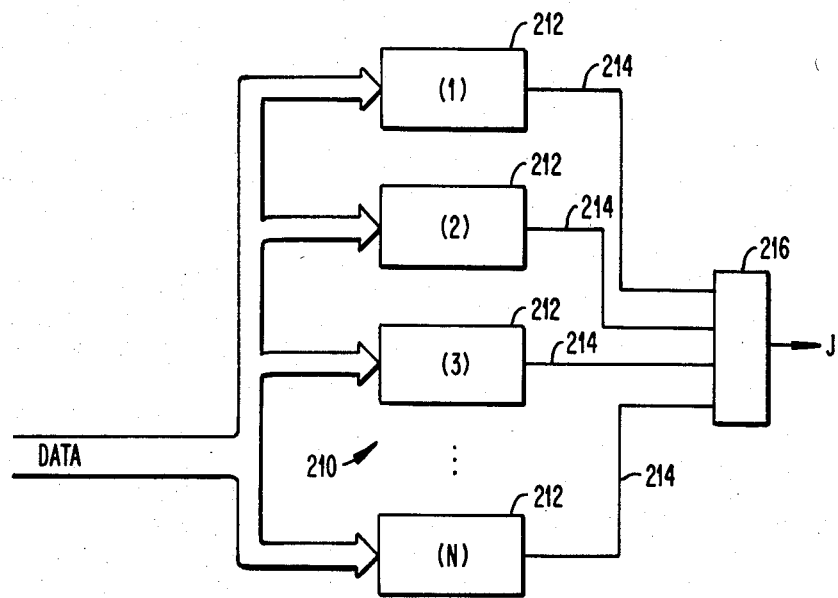
FIG._5.
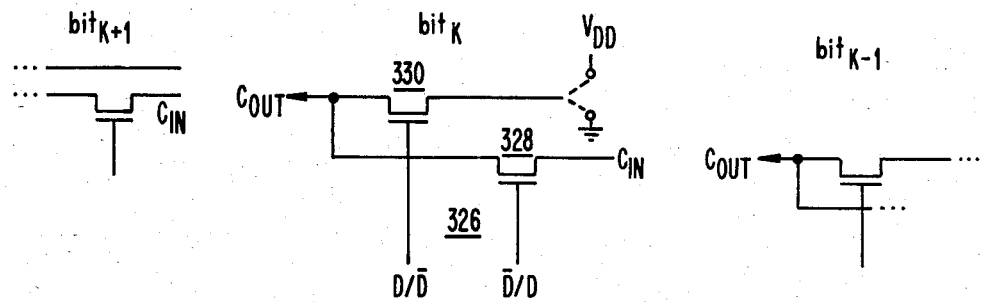
FIG._6a.

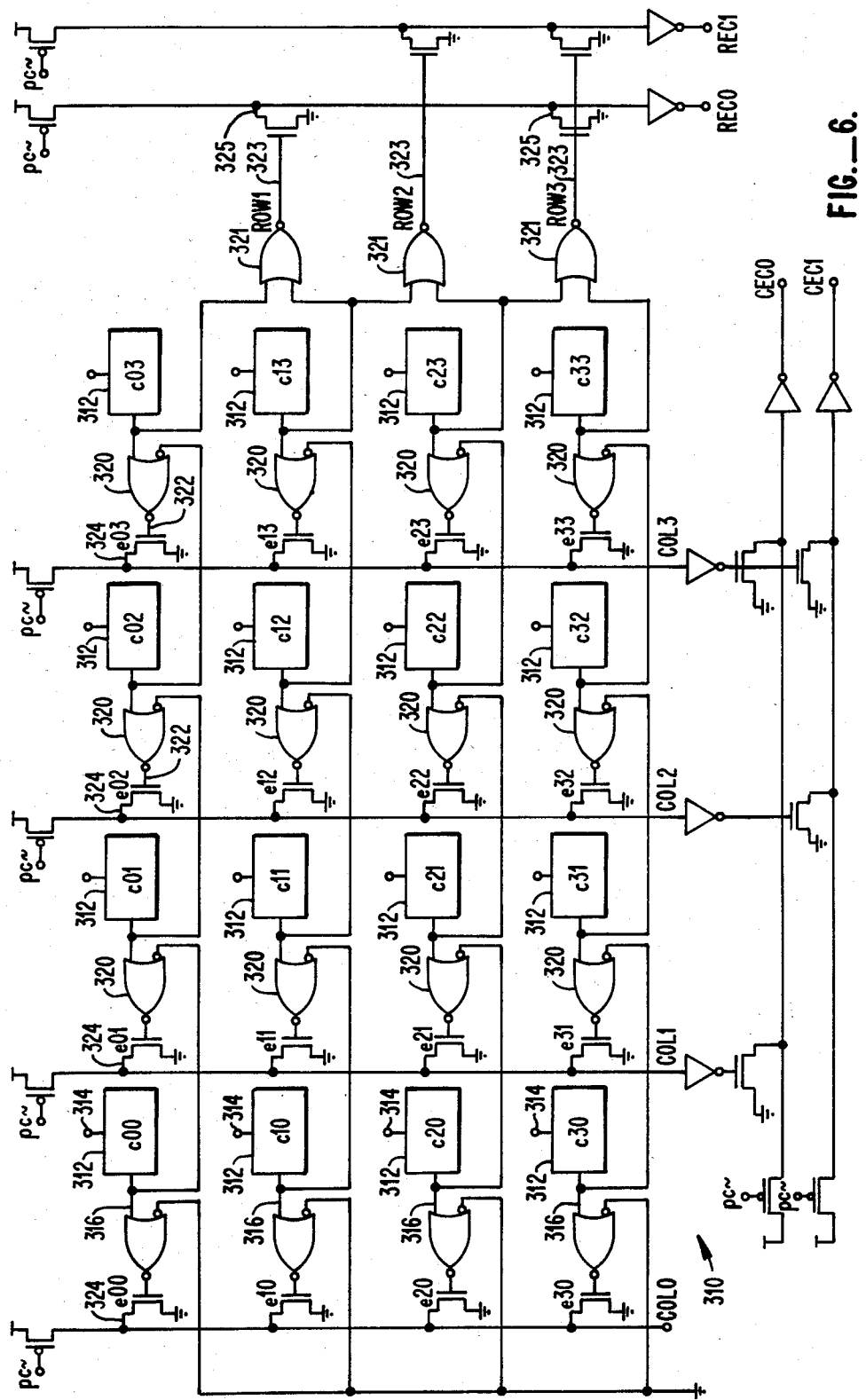
FIG._6.

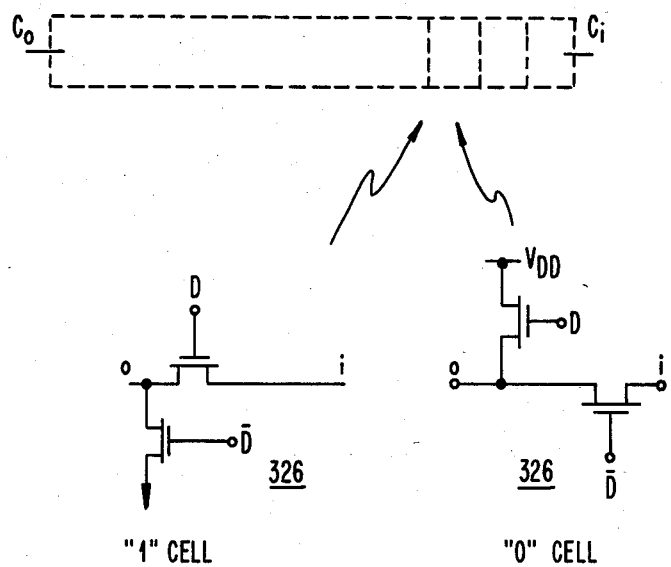
FIG._6b.

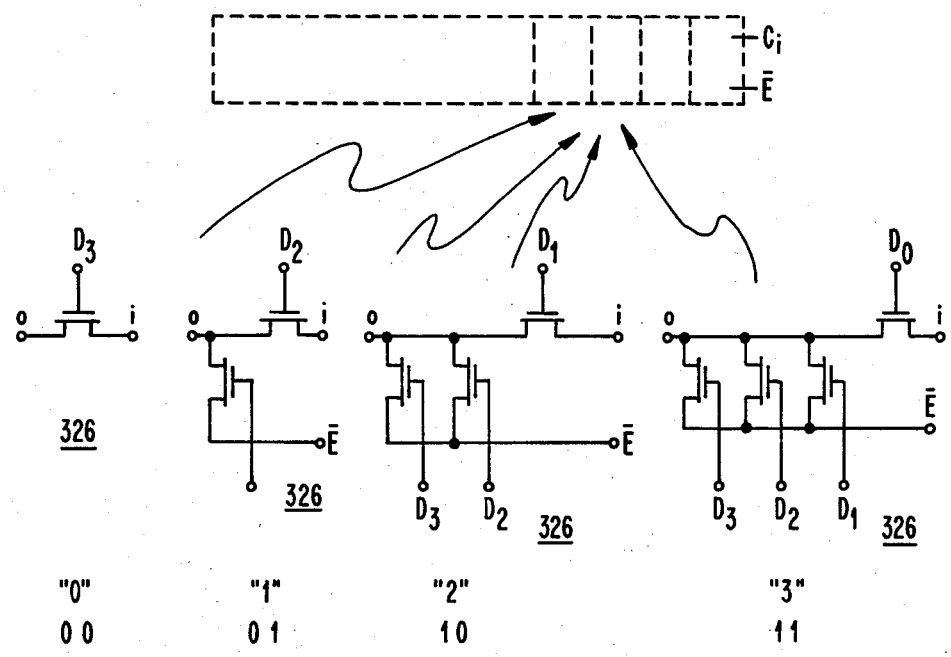
DUAL BIT DYNAMIC CELLS.
$D_3$, $D_2$, $D_1$, $D_0$ ARE DECODE OF TWO BIT INPUT SIGNAL AND ALL 4 MUST BE HIGH DURING PRECHARGE
FIG._6c.

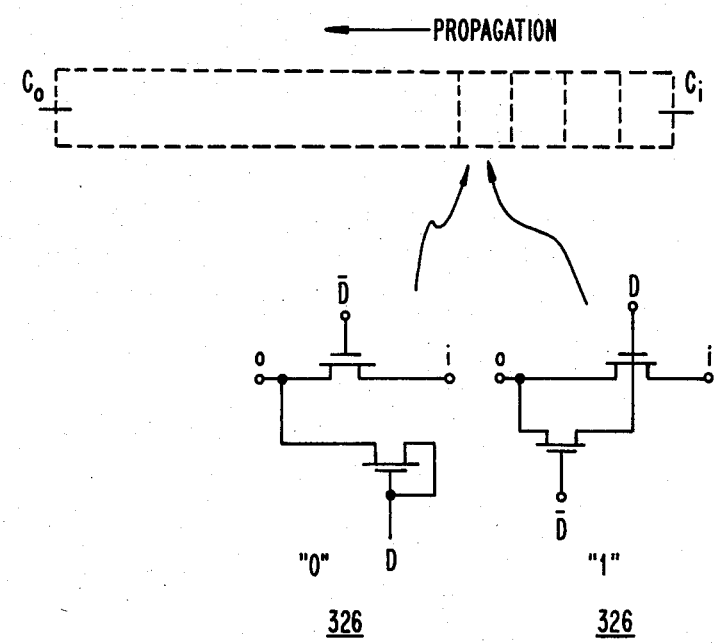
FIG._6d.

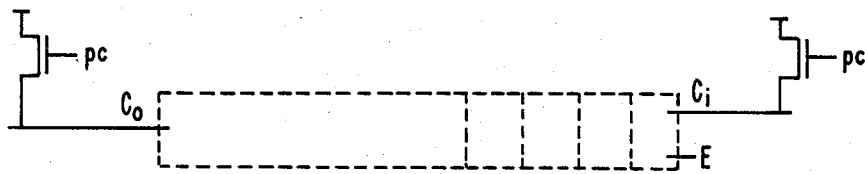
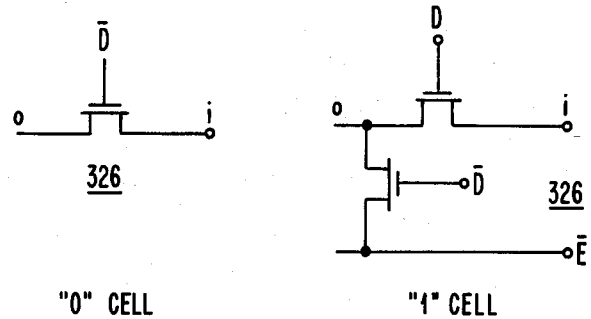
"0" CELL          "1" CELL
DYNAMIC CARRY CHAIN
    $\bar{E}$ = LOW TO ACTIVATE THE EVALUATION
PRECHARGE
    $\bar{E}$ = $\bar{D}$ = HIGH
EVALUATE
    $\bar{E}$ GOES LOW
    D, $\bar{D}$ ARE INPUT DATA AND $\overline{DATA}$
FIG._6e.

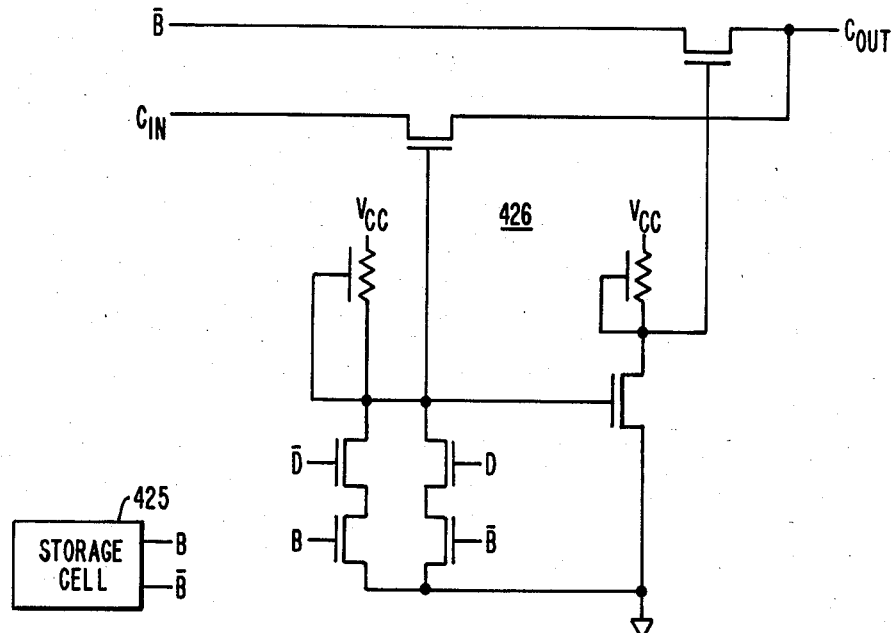
FIG._8.
FIG._7.
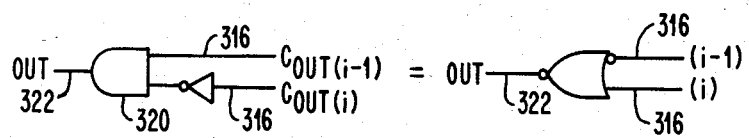
$C_{OUT} = \bar{B} \cdot \overline{EQ} + C_{IN} \cdot EQ = D > B$
$EQ = \overline{D \cdot \bar{B} + \bar{D} \cdot B}$
$OUT_i = \overline{C_{OUT_i}} \cdot C_{OUT(i-1)} = (D \leq B_i) \cdot (D > B_{i-1}) = B_{i-1} < D \leq B_i$
FIG._9.

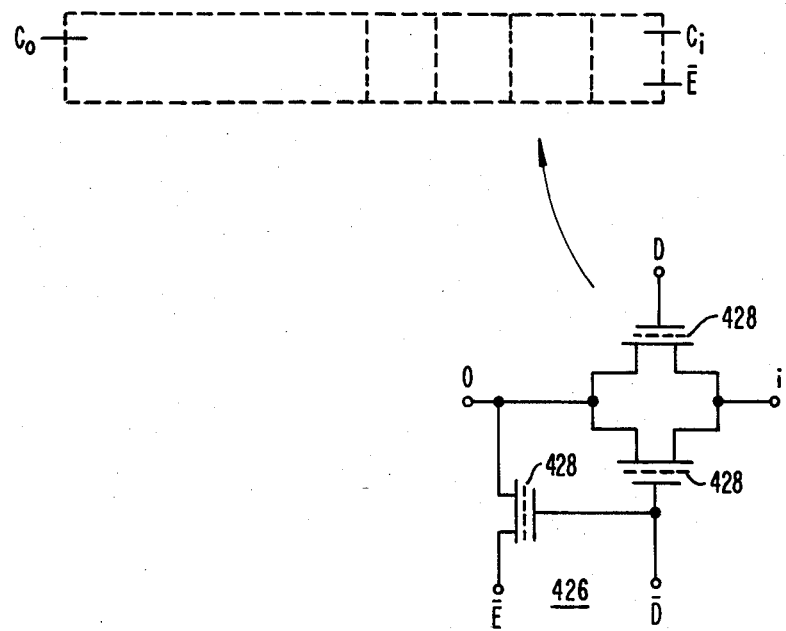
FIELD PROGRAMMABLE "1/0" CELL
OR
SINGLE MASK (IMPLANT) PROGRAMMABLE
BY REMOVING FLOATING GATE (-----)
AND CAUSING TRANSISTOR TO BE ALWAYS
OFF/ON OR SWITCHABLE BY GATE SIGNAL
FIG._8a.

LOGARITHMIC CONVERSION APPARATUS

DESCRIPTION

Technical Background

The present invention relates to a logarithmic conversion apparatus and, more particularly to an apparatus for converting integer data into logarithmic data and for converting logarithmic data into integer data.

BACKGROUND OF THE INVENTION

Systems for converting integer data into logarithmic data, operating on the logarithmic data, and then reconverting it into integers are well known. See *IEEE Transactions On Computers*, Vol. C-32, No. 6, June 1983, pages 531–534, wherein a logarithm arithmetic calculating unit is disclosed. In addition, see *Eletron. Lett.* 7:56–58 (1971), pages 215–217, article entitled "Digital Filtering Using Logarithmic Arithmetic"; *IEEE Transactions On Computers*, Vol. 24, No. 8, August 1975, pages 761–765, article entitled "Multiplication Using Logarithms Implemented With Read-Only Memory" by Brubaker, et al.; *IEEE Transactions On Acoustics, Speech And Signal Processing*, Vol. ASSP-31, No. 1, February 1983, pages 232–234; *IEEE Transactions On Computers*, December 1975, pages 1238–1242; *IEEE Transactions On Computers*, Vol. C-32, No. 6, June 1983, pages 526–530; see also "The Implementation Of Logarithmic Arithmetic" by Bechtolsheim, et al., Stanford University, Mar. 7, 1981; and *IEEE Transactions On Acoustics, Speech And Signal Processing*, Vol. ASSP-28, No. 6, December 1980, article entitled "Error Analysis of Recursive Digital Filters Implemented With Logarithmic Number Systems" by Kurokawa, et al.

All of the prior art systems have converted integer numbers into logarithmic numbers, operated thereon, and reconverted the logarithmic numbers back into integers, based upon either software or hardware implementation.

In software implementation, the problem typically has been that it requires a number of machine cycles to accomplish the task. In certain applications, such as digital signal processing or Fourier analysis, speed is a requisite element. Thus, software conversion is impractical.

In the hardware implementation of a logarithmic calculating unit or logarithmic processor, the greatest impediment to implementation is the cost of the hardware. The look-up table to convert and operate on logarithms has generally required extensive amount of memory and, consequently, cost is the drawback.

Digital memory circuits, such as ROM's (Read-Only Memories) or RAM's (Random Access Memories), are well-known in the art. These memory circuits receive an input digital signal, which represents the location of the memory cell to which data is desired to be accessed. Typically, the input digital signal is called an address signal. In response to the address signal, the memory content at the location of the address is then either supplied to the memory circuit or is retrieved therefrom. These memory circuits are deterministic in that, for each address signal, there is a unique memory location from which the data associated with that memory location is either retrieved from the memory cell or is supplied to that particular memory cell.

Digital comparators are also well-known in the art. A digital comparator receives an input digital signal and compares it to a stored digital signal. In response to that comparison, an output signal is generated.

Finally, flash analog to digital converters are also well-known in the art. A flash A-D converter is a high speed analog-to-digital converter in which analog data is supplied to a linear array. A plurality of analog comparators in the array compares the analog signal and produces a plurality of digital signals. Each analog comparator is a reference voltage comparator, or is an A-D converter.

SUMMARY OF THE INVENTION

In the present invention, a digital apparatus for converting a digital binary integer having a plurality of bits into a logarithmic representation and vice versa is disclosed. For converting the digital binary integer into logarithmic representation, the apparatus has means for determing the bit position of the leading non-zero bit of the integer. The apparatus further has means for shifting the integers such that the leading non-zero bit is the leftmost bit. A table means receives the shifted integer and provides a number representative of the mantissa portion of the logarithm of said shifted number. The apparatus further has encoding means for receiving a Point Set Input value and the number of binary position shifted by the shifting means and for generating the exponent portion of the logarithm of said integer. Thus, the mantissa portion and the exponent portion form the logarithmic representation of the integer.

The digital apparatus for converting the logarithmic representation of an integer to a binary integer comprises a table means for receiving the mantissa component of the logarithmic representation and for providing a first number. A decoding means receives the exponential portion of the logarithmic representation and a Point Set Output value and supplies a shift signal. A shifting means receives the shift signal and the first number and shifts the first number by the shift signal to produce the integer.

BRIEF DESCRIPTION OF THE DRAWINGS

FIG. 1 is a block diagram of a digital processor having a controller means, a logarithmic converting means, a logarithmic calculating means, and a data memory means.

FIG. 1a is a schematic block diagram of the instruction decoder portion of the processor, shown in FIG. 1.

FIG. 1b is a schematic block diagram of the address register file portion of the processor, shown in FIG. 1.

FIGS. 1c and 1d are schematic block diagrams of the index unit portion of the processor, shown in FIG. 1.

FIG. 2 is a block diagram of the logarithmic converting means.

FIGS. 2a and 2b show the operation of the logarithmic converting means shown in FIG. 2 in the two modes of operation; i.e., conversion of integer data into logarithmic data and conversion of logarithmic data into integer data.

FIG. 3 is a block diagram of the data register file, shown in FIG. 1.

FIG. 4 is a block diagram of the logarithmic calculating means shown in FIG. 1.

FIG. 4a is a graph of x and $\log_2(1 \pm 2^{-x})$.

FIG. 4b is a schematic drawing of a portion of the logarithmic calculating means, shown in FIG. 4.

FIG. 5 is a schematic drawing of a Comparator Array Logic Circuit.

FIG. 6 is a schematic circuit of another embodiment of a Comparator Array Logic Circuit.

FIG. 6a is a circuit diagram of a bit comparator which is a portion of the Comparator Array Logic Circuit of FIG. 6.

FIG. 6b are circuit diagrams of the bit comparator, shown in FIG. 6a programmed.

FIGS. 6c, 6d and 6e are other embodiments of bit comparators.

FIG. 7 is a logic circuit diagram of an end cell used in the Comparator Array Logic Circuit, shown in FIG. 6.

FIG. 8 is another bit comparator which can be used in the Comparator Array Logic Circuit, wherein the stored value is changeable.

FIG. 8a is another embodiment of a bit comparator, wherein the stored value is changeable.

FIG. 9 depicts logic equations and truth tables associated with the Comparator Array Logic Circuit.

DETAILED DESCRIPTION OF THE DRAWINGS

Referring to FIG. 1, there is shown a block diagram of a digital signal processor 10. The digital signal processor 10 has a address bus 12 and a data bus 14, each sixteen bits wide, connected thereto for communication with other digital apparatuses, such as memory and other microprocessors.

The digital processor 10 comprises a controller 16, a logarithmic converter 18, a data register file 20, and a logarithmic calculator 22. The controller 16 is connected and communicates with the logarithmic converter 18, the data register file 20 and the logarithmic calculator 22 via an internal instruction bus 24. The processor 10 further comprises a control unit 36 which receives or originates control signals for the data bus 14 and address bus 12, external to the processor 10. Such control unit 36 is well-known in the art.

The controller 16 further comprises a program cache memory 26, with a program counter 28, an instruction decoder 30, an address register file 32, and an index unit 34.

The data bus 14 is connected to sixteen status registers 13. The contents of the status registers 13 are updated by all the units, e.g., converter 22 and calculator 18 of the processor 10 and is accessible to the external processor 10. These status registers 13 also perform jump controls depending upon the status registers 13. The data bus 14 is also connected to the program cache memory 26 and to the data register file 20 of the processor 10 for communication therewith. The address bus 12 is communicably connected to the address register file 32, the index unit 34 and the program counter 28. The internal instruction bus 24 connects the program instruction decoder 30 to the address register file 32, the index unit 34, the program counter 28, the logarithmic converter 18, the data register file 20 and the logarithmic calculator 22.

As is common in all von Neuman machines, program and data are stored in memories (not shown), outside the processor 10, which are accessed by the address bus 12 and the data bus 14. When a program instruction is fetched, it is supplied on the data bus 14 and is loaded into the program cache memory 26. When data is fetched, it is supplied on the data bus 14 and is supplied to the data register file 20. The address for the memory location which contains either program or data is supplied on the address bus 12.

The program cache memory 26 and the program counter 28 are conventional pieces of hardware which are well known in the art. The program cache memory 26 is a cache conventional memory of thirty-two registers, each having thirty-two bits. Since the data bus 14 is only sixteen bits wide, it requires two memory loads from the data bus 14 to fill each register of the program cache memory 26.

The instruction decoder 30 decodes each internal instruction of the processor 10 and formulates the instructions which control the program counter 28, the address register file 32, the index unit 34, the logarithmic converter 18, the data register file 20, and the logarithmic calculator 22.

The address register file 32 is a four-port RAM memory comprising of sixteen registers, each with sixteen bits. The index unit 34 performs address indexing from four address inputs from the address register file 32.

In the operation of the digital signal processor 10, integer data from the data bus 14 is supplied to the data register file 20. The data register file 20 is a multi-port memory with eight, sixteen bit registers. The logarithmic converter 18 communicates with the data register file 20 and receives the integer data therefrom. The logarithmic converter 18 converts the integer number into logarithmic number and stores it in the data register file 20.

The logarithmic calculator 22 is also in communication with the data register file 20. The logarithmic calculator 22 receives the logarithmic numbers stored in the data register file 20 and operates thereon. Such operation includes the steps of addition, subtraction, multiplication, division, multiply and accumulate, special FFT, and complex arithmetic. After the operation, the logarithmic calculator 22 returns the resultant logarithmic number and stores it in the data register file 20.

Thereafter, the logarithmic converter 18 receives the logarithmic number from the data register file 20 and converts it into integer data. This integer data is then stored in the data register file 20. The number in integer form is then supplied to the data bus 14 for output to other digital apparatuses external to the processor 10.

While the processor 10 has been described as being useful for the conversion and operation of data in the logarithmic domain, clearly, the processor 10 can be used to convert and to operate data in other domains, such as floating point. In which event, the converter 22 converts integer data into floating point data, and vice versa. Similarly, the calculator 18 would be a floating point calculator.

In addition, the processor 10 has been described with a program cache memory 26 which receives program instructions along the data bus 14, external to the processor 10. Clearly, the program cache memory 26 can also be a ROM such that all program instructions are self-contained within the processor 10.

Instruction Decoder

Referring to FIG. 1a, there is shown in greater detail the instruction decoder 30. The instruction decoder 30 receives each thirty-two bit instruction from the program cache memory 26 and stores it in an instruction register 38.

From the instruction register 38, fifteen selected bits of the thirty-two bits are decoded as instructions to Jump Register, which are supplied to the index unit 34 and to the program counter 28. The instruction can be decoded as an immediate jump, in which event it is used by the index unit 34. If the instruction is a jump target, it is used by the program counter 28. Another combination of selected sixteen bits of the thirty-two bits are supplied to the address register file 32 to address the particular register(s) within that address register file 32. Yet another combination of selected four bits of the thirty-two bits are supplied to the index unit 32 as instructions for address functions. Finally, a selected combination of six bits of the thirty-two bits are supplied to the status registers 13 as instructions for jump conditions.

A selected combination of seven bits of the thirty-two bits are supplied to an instruction ROM 40. The instruction ROM 40 comprises of one hundred twenty-eight ROM locations, each with twenty bits. The selected combination of seven bits from the instruction register 38 are used to address the particular ROM location within the instruction ROM 40. The combination of two to the power of seven is one hundred twenty-eight. Thus, any one of the one hundred twenty-eight locations in the instruction ROM 40 can be addressed by the seven bits. The output of the instruction ROM 40 is twenty bits wide. Eighteen of those bits are used to address the particular register(s) in the data register file 20. The other two bits from the instruction ROM 40 are used to control the logarithmic engine 18 and the logarithmic converter 22; one bit selects the operation of the enginee 18 or the converter 22; the other bit selects the engine 18 to multiply or divide.

Yet, another selected combination of nine bits, four of which are the same as the four bits for the address function, are supplied to an instruction PLA 42. The instruction PLA 42 also receives a control bit from the control 36. If the control bit is high or "1", then the nine bits supplied to the instruction PLA 42 determines who would have access to the instruction bus 24. If the control bit from the control 36 is low or "0", then the instruction PLA 42 is inhibited and, thus, no one has access to the instruction bus 24. The instruction PLA 42 is a programmable logic array of $10 \times 10 \times 18$, which means there are ten inputs, ten outputs and eighteen product terms. The ten output bits determine the format of the microprogramming. One of the ten bits is for the operation of the logarithmic engine 18 and the logarithmic converter 22. That bit, when on, enables the engine 18 or the converter 22. Two of the ten bits are address jumps and are supplied to the program counter 28 and control 36. Five of the ten bits control the data bus 14. They are used, in part, to write and read from the data register file 20 onto the bus 14. The remaining two bits are memory control bits also supplied to the control 36. The programming of the PLA array 42 to select the particular outputs from the particular inputs is well-known to those skilled in the art.

Finally, four bits that are the address function bits are also supplied to a logic decoder 44. The logic decoder 44 determines that if those four address function bits are in the bit pattern of "0000", then the one-bit output halts the operation of the controller 16.

All of the foregoing outputs of the instruction decoder 30 are supplied in parallel and are continuously supplied to their destination.

Address Register File & Index Unit

Referring to FIGS. 1b, 1c, and 1d, there is shown the address register file 32 and the index unit 34 in greater detail. As previously stated, the address register file 32 is a four-port RAM memory comprising of sixteen registers, each with sixteen bits. The four ports are designated in FIG. 1c as $A_0$, $A_1$, $A_2$, and $A_3$. Each port is a read port and is sixteen bits wide and receives the contents of one register from the address register file 32. As can be seen from FIGS. 1, 1b and 1c, a write port is also supplied to the address register file 32. This is designated as $W_0$. The write port $W_0$ is also sixteen bits wide and is used by the address bus 12 or by the index unit 34 to write into the address register file 32. The write port $W_0$, however, is multiplexed or shared with the read port $A_0$. Thus, the address register file 32 has only four ports.

Since there are sixteen registers in the address register file 32, it would take four bits to address a particular register. Since there are also four ports, sixteen address register addresses are required to select the contents of the four registers to place them on the four ports. Furthermore, one of the sixteen registers in the address register file 32 is a read-only register and contains all zeros.

The addresses for the address register file 32 are supplied to an address decoder 31. The decoder 31 has sixteen identical decode sections with each section connected by a plurality of word lines to a register in the register array 33. For the fifteen read/write registers, six word lines are supplied: four to select the read port(s), one to select the write port and keep to control the latch that holds the data. For the read-only register, only four word lines connect the decoder 31 to the register array 33. The four lines are used to select the read port(s).

The four word lines to select the read port(s) are connected to a read port cross-point matrix 35 which connects the latch 37, holding the data, onto one or more of the read ports: $A_0$, $A_1$, $A_2$ or $A_3$.

The single word line to select the write port is connected to a write switch 39 which connects the latch 37, onto the write port $W_0$.

The output of the register array 33 is supplied to an I/O buffer 41.

The four bits that determine the address function from the instruction decoder 30 are supplied to an address function decoder 46. The address function decoder 46 decodes the four bits of address function, and sets the appropriate bit flags. Some of the instructions which the address function decoder 46 can decode are as follows:

| Mnemonic | Bit Pattern | Description |
|---|---|---|
| IFXX | | If condition is true: |
| | | $A_0 = A_0 + A_1$ |
| | | flag (f) = 1 |
| | | If condition is false: |
| | | $A_0 = A_3$ |
| | | f = 0 |
| | | Condition To Be Tested: |
| IFNE | 1011 | $A_0 \neq A_2$ |
| IFLTU | 1100 | $A_0 < A_2$ (unsigned) |
| IFSEU | 1101 | $A_0 >= A_2$ (unsigned) |
| IFLTS | 1110 | $A_0 < A_2$ (signed) |
| IFSES | 1111 | $A_0 >= A_2$ (signed) |

The decoder 46 to decode the above bit pattern is well-known to one skilled in the art.

The various bits of the conditions that represent the particular address function code is supplied to an address condition code tester 48, which is shown in greater detail in FIG. 1c. Thus, if the bit pattern of "1011" is decoded, then the bit line for IFNE is set high.

The index unit 34 also has a subtractor 50 which produces the term $A_0-A_2$. The output of the subtractor 50 is supplied to the condition code tester 48. The index unit 34 also has a multiplexer 52 which receives the address from $A_0$ and from $A_2$. Depending upon the decoder 46, the multiplexer 52 is accordingly activated. From the multiplexer 52, the output signal is supplied to an adder 54. The adder 54 also receives the address from $A_1$. Thus, the output of the adder 54 is either $A_1+A_0$ or $A_1+A_2$, depending upon the condition of the multiplexer 52. The output of the index unit 34, depending upon the test conditions of the address function, is then supplied to the address bus 12 which is again supplied to the address register 32 through the $W_0$ port.

One particular function of the address register file 32 with the index unit 34 is the ability to automatically increment or decrement by a discrete amount, to compare it to a test address and to load a reload address back into the address register file 32, all in a single clock cycle.

For example, the address from the port $A_0$ can contain the address of the memory location on the current operation. The address in port $A_1$ can contain the incremental value. The address in port $A_2$ can contain the test address. The address from port $A_3$ can contain the reload address. The benefit of auto increment or decrement by a certain amount, check and reload the address in a single instruction can be seen in vector operations. For example, if an array is multiplied by a vector of the following form:

$$\begin{pmatrix} Y_{00} & Y_{01} & \cdots & Y_{0n} \\ Y_{10} & Y_{11} & \cdots & Y_{1n} \\ \vdots & & & \\ Y_{m0} & Y_{m1} & \cdots & Y_{mn} \end{pmatrix} \begin{pmatrix} X_0 \\ \vdots \\ X_n \end{pmatrix}$$

The addressing would occur in the following manner:

| Operation Number | Addresses | | | |
|---|---|---|---|---|
| | $A_0$ Current Operation | $A_1$ Increment | $A_2$ Test | $A_3$ Reload |
| 1 | $X_0$ | 1 | $X_n$ | $X_0$ |
| 2 | $X_1$ | 1 | $X_n$ | $X_0$ |
| . | . | . | . | . |
| . | . | . | . | . |
| . | . | . | . | . |
| n | $X_{n-1}$ | 1 | $X_n$ | $X_0$ |
| n + 1 | $X_n$ | 1 | $X_n$ | $X_0$ |
| n + 2 | $X_0$ | 1 | $X_n$ | $X_0$ |

As can be seen, when the address from port $A_0$ reaches the address $X_n$ and if the condition to be tested is $A_0$ not equal to $A_2$ (instruction IFNE); that is, if this condition of $A_0$ not equal to $A_2$ is false or $A_0$ equals $A_2$, then the address from port $A_3$ is assigned to $A_0$. In other words, when the address from port $A_0$ reaches the test address from port $A_2$, the address on port $A_3$ is loaded onto $A_0$. Since the $W_0$ port shares the port with $A_0$, the address from $A_0$ is written back into the address register file 32. Thus, the vector multiplication operation, upon reaching $X_n$, can continue to $X_0$ using only a single clock cycle.

This is illustrated by referring to FIGS. 1c and 1d. If the condition to be tested is "IFNE", then the IFNE bit line is set high or "1". On the n+1 operation when $A_0=A_2$, the difference from the subtractor 50 is zero. Thus, the input to the NOR gate 47 would be all "0" resulting an output of "1". When inverted, this results in a "0" supplied to NAND gate 49, which results in a "1" on the output. Following the inverters, the output of "true" is "0".

The output of the NOR gate 51 is "1" which gates the tristate 53. Thus, $A_3$ is loaded on to bus 12 which, in turn, is supplied to $W_0$.

It should be noted that, with an address register file 32 having a particular register of all "000 . . . ", the register file 32 in conjunction with the index unit 34 can be programmed to increment or decrement by "0 . . . 0", thereby causing the same current address to be used repetitively.

Logarithmic Converter

The logarithmic converter 18 is shown in greater detail in FIG. 2. The converter 18 has sixteen lines of input and sixteen lines of output. The sixteen lines of input serve to supply data in either logarithmic or integer form to the converter 18. The output lines serve to receive converted integer or logarithmic data, respectively, from the converter 18. The integer data supplied to the data processor 10 is in two's complement form. In two's complement form if the leftmost bit is "0", then the number is positive. If the leftmost bit is "1", then the number is negative.

In the processor 10, logarithmic data has the following format:

S b e e e e e m m m m m m m m m where S is the sign of the logarithmic data ("0" for positive and "1" for negative), having an exponent e with the exponent e having a bias sign b, and a mantissa m.

If the data supplied to the converter 18 is in logarithmic form, the leftmost bit is received by the sign operator 60. The remaining fifteen lines of input data in logarithmic form are supplied to a first multiplexer 62. The first multiplexer 62 also has another fifteen lines supplied from the exception designator 64. The multiplexer control is set by L. If L is high, the fifteen lines of signal closest to L is chosen. Thus, if logarithmic data is supplied to the converter 18, L is set low.

The six lines of the input which represent the exponential portion of a logarithmic number (the bias sign, b, and the five bits of exponential value e), are then supplied to the decoder 66. The other nine lines of the fifteen lines of input which form the mantissa portion of the logarithmic number is supplied to an anti-log ROM 68. A six-bit Point Set Output is supplied from a PSO register, which is in the status registers 13. The PSO value is supplied to the decoder 66. The output of the decoder 66 is supplied to the exception designator 64 and to the second multiplexer 70. The fifteen bits of output of the anti-log ROM 68 is supplied to a third multiplexer 72.

Since L is low, the outputs of the second and third multiplexers 70 and 72 are supplied to a barrel shifter 76. The barrel shifter 76 receives the fifteen bits of integer output from the anti-log ROM 68, through the third multiplexer 72, and operates on it by shifting it the number of digits supplied from the decoder 66 through the second multiplexer 70.

The fifteen bits of output are supplied to the exception designator 64 which determines if an underflow or overflow condition has occurred. In that event, the designator 64 sets the status bit and generates the smallest or largest integer number, which is supplied to the sign operator 60.

The sign operator 60 performs a two's complement operation and the number is supplied to a fourth multiplexer 84. With L set low, the number from the sign operator 60 then becomes the output of the converter 18.

If the input number is in integer form, L is set high and all sixteen bits are provided to the sign operator 60. The sign operator 60 generates the sign S of the logarithmic representation and also performs a two's complement to convert the integer number into uncomplemented representation.

From the sign generator 60, fifteen lines of data are then supplied to a Mfind 74. The fifteen lines are also supplied to the third multiplexer 72. From the Mfind 74, the output is supplied to the second multiplexer 70. The output of the second and third multiplexers 70 and 72, respectively, are supplied to the barrel shifter 76. The output of the Mfind is also supplied to an encoder 78. Six lines of input comprising the Point Set Input from a PSI register, which is a register in the status registers 13, are also supplied to the encoder 78.

Since L is high, the output of the sign operator 60 and the Mfind 74 are supplied to the barrel shifter 76. The output of the barrel shifter 76 is supplied to a logarithmic CAL 80. The output of the log CAL 60 is the mantissa portion of the logarithm of the input integer data. The nine lines of output are then concatenated with the six lines of output from the encoder 78 to form fifteen lines of output which are supplied to a zero detector 82. The fifteen lines from the sign operator 60 are also supplied to the zero detector 82. The fifteen lines of output of the zero detector 82 are then supplied to the fourth multiplexer 64. The sign bit from the sign operator 60 is concatenated with the fifteen bits of output from the zero detector 82. The output of the fourth multiplexer 84 forms the sixteen bits of output from the logarithmic converter 18.

The sign operator 60, exception designator 64, Mfind 74, and barrel shifter 76 are all conventional pieces of hardware, used in floating point operations. The decoder 66 and encoder 78 are modifications of well-known circuits to accept PSO and PSI values. In one embodiment, the encoder 78 can be a conventional prior art encoder whose output is added to the PSI value to produce the exponential value. One embodiment of the decoder 66 can be a subtractor which subtracts the PSO value from the exponential value with the result supplied to a prior art decoder. The anti-log ROM 68 is merely a read-only memory comprising of 512 addressable locations with fifteen bits in each location. The logarithmic CAL 80 is a Comparator Array Logic Circuit which will be discussed in greater detail hereinafter.

The operation of the converter 18 can be understood by reference to FIGS. 2a and 2b, in which the conversion of integer-to-log and log-to-integer is shown, respectively.

Referring to FIG. 2a, there is shown the portion of the logarithmic converter 18 which performs the function of converting integer data into logarithmic data. The absolute value 60, which is a part of the sign operator 60, uncomplements the input integer data to obtain the uncomplemented representation of the integer data, and supplies the leftmost sign bit as the S bit to the output. The remaining fifteen bits, which is the absolute value of the input integer is supplied to the Mfind 74.

The fifteen bits of input data are also supplied to a zero detector 81. If the input integer data is zero, then a special number ("0 . . . 0") is generated which is understood by the processor 10 as the log of zero. A special number must be generated because mathematically log 0 is indeterminable.

The Mfind 74 looks for the bit position of the leading non-zero bit. Its output is a number which indicates the number of bits which the barrel shifter 76 must shift the input data to the left in order that the leading non-zero bit is placed in the leftmost position. Once the number of bits has been shifted, the fifteen lines of output of the barrel shifter 76 is then supplied to the log CAL 80. The log CAL 80 is a look-up table comprising five hundred twelve, fifteen bit memory cells, which determine, based upon the input integer data, what the mantissa portion of the logarithmic number is. Thus, the output of the log CAL 80 is nine bits of mantissa.

The log CAL 80 stores the values of the logarithmic equation:

$$y = \log_2 x$$

where x is the input and y is the output, with $$1 \leq x < 2$$

The output y will be $$0 \leq y < 1$$

which is the mantissa of the input number x. By having the barrel shifter 76 shift the integer number to
1_____
with the decimal point understood to be to the immediate right of "1", the log CAL 80 accepts x, the input number, as x=1 ._____, and generates the appropriate mantissa. The exponent, i.e., the amount of the shift, is determined by the encoder 78.

The output of the Mfind 74 is also supplied to the encoder 78. The six-bit Point Set Input or PSI is also supplied to the encoder 78. Based upon the output of the Mfind 74 and the PSI, the encoder 78 generates a six-bit number which is the exponential portion of the logarithm of the input number.

The six-bit outputs of the encoder 78 are then concatenated with the nine-bit of output from the log CAL 80 to form the fifteen-bit logarithmic number. The fifteen lines of logarithmic number are supplied to a zero unit 82. If the zero detector 81 has detected the input data as being zero, the zero unit 82 generates the special number discussed heretofore. Otherwise, the fifteen-bit-logarithmic number supplied to the zero 82 is produced as the output. From the zero unit 82, the fifteen lines are combined with the one-bit of sign from the absolute value 60 to form the sixteen bits of output of the logarithmic number.

Referring to FIG. 2b, there is shown the conversion of logarithmic data to integer data. The sixteen bits of input represent the logarithmic data. The leftmost bit of the sixteen input lines is supplied to the sign generator 60. The remaining fifteen bits of input are then divided in accordance with the exponential portion (six bits) and the mantissa portion (nine bits).

The six bits representing the exponential portion are supplied to a decoder 66. Six lines representing the six bits for the Point Set Output or PSO are also supplied to the decoder 66. The output of the decoder 66 is supplied to the barrel shifter 76. The output of the decoder 66 instructs the barrel shifter 76 the number of digits and the direction it must shift. The nine bits of the mantissa portion of the input logarithmic data are supplied to an anti-log ROM 68.

The anti-log ROM 68 is a five hundred twelve, fifteen bit conventional ROM look-up table. The anti-log ROM 68 stores the values of the logarithmic equation $$x = 2^y$$

where y is the input and is $$0 \leq y < 1$$

and x is the output, with $$1 \leq x < 2$$

The output of the anti-log ROM 68 is a fifteen bit integer data. This data is supplied to the barrel shifter 76. The barrel shifter 76 shifts the integer data by the number of bits from the decoder 66. The output of the barrel shifter 76 is then supplied to the exception designator 64 where it is determined whether or not an overflow or underflow condition has occurred. That is, if the decoder 66 instructs the barrel shift 76 to shift too many digits to the right or to the left, an underflow or an overflow condition could occur on the output of the barrel shift 76. The exception designator 64 generates the smallest or largest integer number, if there is underflow or overflow respectively, and generates a signal on the status lines the underflow or overflow condition.

In the event the exception designator 64 finds that the data generated from the barrel shifter 76 is not an overflow or underflow, then the integer data from the shifter 76 is supplied to the sign operator 60 from which the sign bit, the leftmost bit, is concatenated and the sixteen bits of integer data are then outputted from the converter 18.

The function of the Point Set Output (PSO) and the Point Set Input (PSI) is to permit flexibility and dynamic range on the integer number presented on the input or the output of the converter 18. The PSO and PSI permit the user to fit the wide dynamic range of a logarithmic number into a useful portion of a linear number system. Notwithstanding the data being an integer data, the PSO and PSI indicate where the decimal place should be placed on the input or on the output integer data. Although the data bus 14 is only sixteen bits wide, by providing a six bit PSI and PSO, a number with a range of sixty-four bits can be specified. A six-bit PSO or PSI, thus, provides sixty-four bits to the range of the integer. Therefore, where precision is required, the integer data can be stored with as much precision as desired with the decimal place dictated by the PSO or the PSI. On the other hand, where dynamic range is desired, that is, flexibility in the range of determination of the input and output integer data, the integer number can be stored as simply an integer number with PSI and PSO set to zero or a low number, respectively.

Data Register File

Referring to FIG. 3, there is shown the data register file 20 in greater detail. The file 20 has eight, sixteen bit registers of which two are read only registers: one containing all "0"'s, and the other all "1"'s. Since there are eight registers, three-bit lines are needed to address each register.

The file 20 has eight ports: five read ports and three write ports. Six ports (four read and two write) are supplied to the calculator 22. As discussed hereinafter, the four read ports are designated as A, B, C & D and the two write ports are designated as P & M. Since there are six ports used for the calculator function and three-bit lines are needed to address each register for each port, eighteen address lines are needed to address the data register file 20 for the calculator 22 operation. These eighteen lines are from the IROM 40.

Since, at any time, only the converter 22 or the calculator 18 is on, the ports to the converter 22 are shared or multiplexed with the ports to the calculator 18. Thus, the eighteen address lines from the IROM 40 are also used to supply data from the file 20 to the converter 22 (one read port) and to supply data from the converter 22 to the file 20 (one write port).

The other two ports of the file 20 are the one read port to and one write port from the data bus 14. Since the operations of read/write cannot occur simultaneously from the data bus 14, only three address lines are needed for this function. Thus, three of the five bus control lines from the PLA 42 are used as address with another one bus line to select read or write.

The addresses for the data register file 20 are supplied to an address decoder 90. The decoder 90 has eight identical decode sections with each section connected by a plurality of word lines to a register in the data register array 92. For the read/write registers, nine word lines are supplied: five to select the read port(s), three to select the write port and one to control the latch that holds the data. For the two read-only registers, only five word lines connect the decoder 90 to the register array 92. The five word lines select the read port(s).

The five word lines to select the read port(s) are connected to a read port cross point matrix 100 which connects the latch 102, holding the data, onto one or more of the read ports.

The three word lines to select the write port are connected to a write port cross point matrix 104 which connects one of write port to the latch 102.

The output of the register array 92 is supplied to an I/O buffer 94.

The read-only registers containing all "0"'s or all "1"'s can be used in a number of ways. First, the contents of these registers can be used where those numbers are desired in arithmetic operations. Secondly, an operation can be performed and the result "written" into a read-only register. Thus, one can obtain a status update without changing the information output.

Logarithmic Calculator

As previously described, the logarithmic calculator 22 receives logarithmic data from the data register file 20, operates thereon, and returns the resultant logarithmic data for storage in the data register file 20.

Referring to FIG. 4, there is shown the logarithmic calculator 22 in greater detail. The logarithmic calculator 22 performs the tasks of calculating multiplication, division, addition, and subtraction on four logarithmic data. The four input operands to the logarithmic calculator 22 are designated as A, B, C, and D, respectively.

The logarithmic calculator 22 comprises a first multiplier/divider 122, a second multiplier/divider 124, and an adder/subtractor 126.

The first multiplier/divider 122 receives data on the ports A and B, and performs the operation of:

A*B or

A÷B

The second multiplier/divider 124 operates on the operands C and D and performs the result of C(*/÷)D. The output of the first multiplier/divider 122 is the result U, whereas the output of the second multiplier/divider 124 is the result V. The selection of the operation of multiplication or division is controlled by one of the bit lines from IROM 40. The single bit line would control both the first and the second multiplier/divider 122 and 124. However, a separate control line for each is also possible.

The outputs U and V from the first and second multiplier/divider 122 and 124, respectively, are supplied to the adder/subtractor 126 which produces the outputs U+V and U−V, respectively. These are then supplied back to the data register file 20 through the ports P and M, respectively.

Since the logarithmic calculator 22 receives four operands and can perform a multitude of multiplication, division, subtraction and addition, the calculator 22 can perform the following functions in a single operation.

| Function | Input | | | | Output | | Result |
|---|---|---|---|---|---|---|---|
| | A | B | C | D | P | M | |
| add | x | 1 | y | 1 | z | | z = x + y |
| sub | x | 1 | y | 1 | | z | z = x − y |
| multiply | x | y | 0 | 0 | z | | z = x*y |
| mul/accumulate | w | 1 | x | y | w | | w = w + x*y |
| mul/subtract | w | 1 | x | y | w | | w = w − x*y |
| copy | x | 1 | 0 | 0 | y | | y = x |
| FFT add/sub in butterfly | x | 1 | y | 1 | w | z | w = x + y, z = x − y |
| complex mult (real part) | w | x | z | y | t | | t = w*x − z*y |

The "1" and "0" on the input are supplied from the read-only registers in the file 20.

The logarithmic calculator 22, in one embodiment, requires two clock cycles to operate on the four input operands to produce the two output results. To maximize efficiency, the calculator 22 is designed for pipeline processing, i.e., after a single clock cycle, four new operands can be received by the calculator 22 and begin processing thereon. The technique of pipeline processing is well-known in the art. One way to accomplish pipeline processing is to store the results U and V in buffers at the output of the first and second multiplier/divider 122 and 124, respectively. Alternatively, the outputs U and V can be stored at the input to the adder/subtractor 126.

For the case of multiplication and division of two numbers: A and B which have been converted into the logarithmic domain, where a = log$_2$A b = log$_2$B then the calculations become U = A * B $$\log_2 U = \log_2(A*B) = \log_2 A + \log_2 B = a + b$$

similarly, if U = A/B, log$_2$U = a − b

As can be seen from the foregoing, in the logarithmic domain, multiplication and division of integer data is accomplished by addition or subtraction of the respective logarithmic data. Thus, the first and second multiplier/dividers 122 and 124, in performing the tasks of multiplication or division of the integer representation of the data, merely comprises an adder/subtractor for adding or subtracting the logarithmic representation of those integer data with bias correction, saturation and status.

To accomplish the task of addition or subtraction of integer numbers in the logarithmic domain, the following equation is set forth:

$$Z = (U \pm V), Z, U, V \text{ are integers}$$
$$\log_2 Z = \log_2(U \pm V) = \log_2(2^u \pm 2^v), \text{ where } u = \log_2 U \, v = \log_2 V$$

This equation can be written as $$\log_2 Z = \max(u,v) + \log_2(1 \pm 2^{-x})$$

where $x = |u-v|$, max(u,v) is the maximum value of u or v. If $u_s$ and $v_s$ are the signs of u and v, respectively, then $$\log_2 Z = \max(u, v) + \log_2(1 + \sigma 2^{-x})$$

where $\sigma = u_s \oplus v_s$ ($\oplus$ is exclusive or) Graphically, the equation of $\log_2(1+\sigma 2^{-x})$ is shown in FIG. 4a.

The adder/subtractor 126 is shown in greater detail in FIG. 4b. The two logarithmic numbers to which the operations of addition and subtraction is desired are represented by the letters u and v. A first adder/subtractor 128 determines the arithmetic product of u−v. A second adder/subtractor 130 determines the arithmetic product of v−u. The output of the first and second adder/subtractors 128 and 130, respectively, is supplied to a 5th multiplexer 132. The carry-out bit of the second adder/subtractor 130 is supplied to the 5th multiplexer 132 and to the 6th multiplexer 134, 7th multiplexer 136, and 8th multiplexer 138. The input for the 6th, 7th and 8th multiplexers 134, 136 and 138 are (u, v), ($u_s$, $v_s$), and ($u_s$, $\overline{v_s}$), respectively. The carryout-bit of the second adder/subtractor 130 determines if v>u or u>v. If the carry-bit is "high", i.e., v>u, then the contents of adder/subtractor 130 is passed to the index register 140. If the carry-bit is "low", the output of adder/subtractor 128 is stored in index register 140. In any event, index register 140 stores the value of:

$$x = |u-v|.$$

The carry-out bit of the adder/subtractor 130 also determines the output of the 6th, 7th and 8th multiplexers 134, 136 and 138. The output of the 6th multiplexer 134 is max(u, v). The output of the 7th multiplexer 136 is the sign S supplied to the output term (u+v). The output of the 8th multiplexer 138 is the sign S supplied to the output term (u−v).

From the 5th multiplexer 132, the output fifteen bits are supplied to an index register 140 which is then supplied to a zero detector 142. The function of the index register 140 is to temporarily store the data.

The thirteen lines of output of the index register 140 are then supplied to a second and third CALs 144 and 146, respectively.

Each of the second and third CAL's 144 and 146 is five hundred twelve by thirteen bits. The second CAL 144 receives the output of the index register 140 and generates a nine-bit number which is the result of $\log_2(1+2^{-x})$. The third CAL 146 receives the output of the index register 140 and generates the result of $\log_2(1-2^{-x})$. The output of the second CAL 144 is then supplied to a 9th multiplexer 148 which is then supplied to an adder 150. The nine bits of output of the third CAL 146 is concatenated with six higher order bits of "0" to form fifteen bits and is then supplied to a 10th multiplexer 152, which is then supplied to a subtractor 154.

From the index register 140, nine bits of lines are also supplied to a ROM 160 which outputs thirteen lines. The output thirteen lines are then concatenated with two higher order bits to form fifteen bits and is supplied to the 10th multiplexer 152. The fifteen lines of output of the 7th multiplexer 134 is a maximum value of u or v and is supplied to the subtractor 154 and the adder 150. The output of the adder 150 and the subtractor 154 form the result of $\log_2(U+V)$ and $\log_2(U-V)$, respectively.

The theory of operation of the logarithmic calculator 22 is as follows. As previously stated, the first and second adder/subtractors 128 and 130, respectively, determine whether or not v is greater that u or u is greater than v. The absolute value of the quantity of (u−v) is stored in the index register 140. This is the value of x. If x is equal to zero, it is detected by the zero detector 142. It should be noted that x is still in logarithmic representation and has the following form:

$$\underline{S}\ \underline{b}\ \underline{e}\ \underline{e}\ \underline{e}\ \underline{e}\ \underline{e}\ \underline{m}\ \underline{m}\ \underline{m}\ \underline{m}\ \underline{m}\ \underline{m}\ \underline{m}\ \underline{m}\ \underline{m}$$
$$5\ \ 4\ \ 3\ \ 2\ \ 1\ \ 0\ \ 8\ \ 7\ \ 6\ \ 5\ \ 4\ \ 3\ \ 2\ \ 1\ \ 0$$

The thirteen bits of x comprising nine bits of the mantissa and the first four bits of the exponent portion (bits 0–3 of e) are supplied to the second CAL 144. As previously described, the output of the second CAL is the result $\log_2(1+2^{-x})$. As can be seen from FIG. 4a, the output of the second CAL 144 is always a number lying between zero and plus one. Thus, the nine bits of output from the second CAL 144 will be of the mantissa portion only.

The two most significant bits of the exponent portion of x, i.e., bits 4–5 of e are then supplied to a test unit 149. The test unit 149 determines if these two bits are zero. If the result of the test unit 149 is that both of these bits are zero, then the test unit 149 selects the multiplexer 148, such that the output is from the second CAL 144. On the other hand, if the result of the test unit 149 on these two bits is that they are not equal to zero, then all zeros are placed on the output of the multiplexer 148.

If the two most significant bits of the exponent portion of x show that they are not equal to zero, then this means that x is a very large number. As can be seen from FIG. 4a, with a very large number, the value of $\log_2(1+2^{-x})$ asymptotically approaches zero. Thus, zero is the output of the multiplexer 148. On the other hand, if the test on the two most significant bits of the exponent portion of x show that they are both equal to zero, then the value of x is not such a large number as to warrant an output of all zeros. Thus, the output of the second CAL 144 is then passed through the multiplexer 148.

The adder 150 receives the output of the multiplexer 148 and adds to it the value from the output of the multiplexer 144, which, as previously described, supplies the maximum value of u or v. Thus, the output of the adder 150 is the term $\max(u,v)+\log_2(1+2^{-x})$, which is $\log_2(U+V)$.

From the index register 140, the thirteen bits of the value of x comprising the nine bits of the mantissa and the four least significant bits of the exponent, i.e., bits 0–3 of e, are also supplied to the third CAL 146. The output of the third CAL 146 is the expression $\log_2(1+2^{-x})$. The nine bits of the output of the third CAL 146 are the mantissa portion of the expression $\log_2(1-2^{-x})$. If x is greater or equal to one, the expression $\log_2(1-2^{-x})$ will be of a number between zero and minus one. The nine bits of mantissa are concatenated with six bits of zero to form the fifteen bits of output which are supplied to the multiplexer 152.

In the event x is between zero and one, as can be seen from FIG. 4a, the output of $\log_2(1-2^{-x})$ is a number between minus one and minus infinity. Since this is a mapping of a few numbers to a large number of numbers, a ROM 160 is used. The nine bits of the mantissa portion of x are supplied to the ROM 160 with the result that thirteen bits of output are provided. The thirteen bits of output are supplemented by two more bits, forming the bias sign of the exponent portion (which would be "0" for a negative bias) and the high order bit for the exponent which would be "1". These fifteen bits are then supplied to the multiplexer 152. A second test unit 151 tests the four lower order bits of the exponent portion of x, i.e., bits 0–3 of e. The results of the first test unit 149 and the second test unit 151 are supplied to a logic decoder 153 which controls the operation of the multiplexer 152.

The operation of the multiplexer 152 is understood as follows: If all six bits of the exponent e are equal to zero, and the zero detector 142 does not equal to zero, then the output of the ROM 160 is selected. If the zero detector 142 is equal to zero, then the output of the multiplexer 134, i.e., max(u,v) is the output of the multiplexer 152. If the output of the test unit 149 is not equal to zero, then the output of the multiplexer 152 is all zeros. Finally, if the output of the test unit 151 is not equal to zero and the output of the test unit 149 is equal to zero, then the output of the third CAL 146 is selected. The output of the multiplexer 152 is subtracted from the maximum value of u or v by the subtractor 154.

The selection by the multiplexer 152 is based upon the following. If the exponent portion of x is all zero, and the zero detector 142 does not detect x is zero, then clearly x is a number between zero and one, and the output of ROM 160 is selected. If x is zero, then the $\log_2(1-1)$ is an indeterminant number and as previously discussed, the processor 10 creates a special number. Max(u,v) is selected from multiplexer 152 which is subtracted from itself in subtractor 154. Thus, the output of subtractor 154 is the special number of "0 . . . 0". If the output of test unit 149 is not equal to zero, then x is a large number in which case $\log_2(1-2^{-x})$ will be a number asymptotically approaching zero. Thus, multiplexer 152 selects a number which is all zero. Finally, if the output of the test unit 149 is zero, i.e., x is not a large number, and the output of the test unit 151 is not zero, i.e., x is greater than +1, then the output of the third CAL 146 is selected.

Since the number $\log_2(1-2^{-x})$ is always a negative number (see FIG. 4a), it is thus subtracted from max- (u,v) by the subtracter 154 to produce the desired output of max(u,v)+log$_2$(1−2$^{-x}$), which is log$_2$(U−V).

Comparator Array Logic Circuit

Referring to FIG. 5, there is shown a Comparator Array Logic circuit 210. The circuit 210 comprises a plurality of comparators 212. In the circuit 210, shown in FIG. 5, there are N such comparators 212. Each of the comparators 212 has a digital value stored therein. The digital values stored in the N comparators are stored in a monotonically increasing or decreasing order. By monotonically increasing or decreasing, it is meant that the digital values stored in the N comparators 212 are all stored in an ascending order or in a descending order.

Each of the comparators 212 receives an input data signal which represents an input value. Each of the comparators 212 compares the digital value stored therein to the data which it receives. In response to that comparison, each of the comparators 212 generates a comparison signal. The comparison signal determines whether the stored value in each comparator 212 is strictly greater than or not which implies that the stored value is less than or equal to the input data value. Each of the comparison signals is supplied along an output line 214. The plurality of output lines 214 is supplied to an encoder 216. The encoder 216 generates an output signal which represents the location of the comparator 212 whose stored digital value borders the value of the input data. The output of the encoder 216 may be the location of the comparator 212 whose value borders the input digital data by being immediately greater than or equal to the input digital data. Conversely, the output of the encoder 216 may be the location of the comparator 112 whose stored value borders the value of the input data by being immediately less than the input data.

Because data is typically stored in a two-dimensional array so that fewer access lines than a one-dimensional array are required, the comparator logic circuit 210 may be similarly arranged in a two-dimensional array form. This two-dimensional array would save considerable wiring and would make the circuit 210 more compact. Also, the encoder 216 would be more compact and practical. For example, a linear array of five hundred twelve comparators 212 would require an encoder 216 with five hundred twelve inputs. However, a two-dimensional encoder would require only forty-eight inputs, arranged in 16×32 (512=16×32).

Referring to FIG. 6, there is shown another Comparator Array Logic (CAL) circuit 310. The CAL circuit 310 is a two-dimensional array comprising a plurality of rows and a plurality of columns. Within each row of the CAL circuit 310 are a plurality of interconnected comparators 312. Within each column is a plurality of interconnected comparators 312. Each of the comparators 312 stores a digital value. The array of plurality of comparators 312 is arranged such that the stored values in the comparators 312 are stored in a monotonically increasing or decreasing order. Each comparator 312 is depicted as $C_{ij}$ where i is the row number and j is the column number. The digital values may be stored in the CAL circuit 310 such that $C_{00}<C_{01}<C_{02}<C_{03}<C_{10}$ ... $<C_{33}$. Thus, within each row $C_{ij}<C_{i(j+1)}$ and within each column $C_{ij}<C_{(i+1)j}$. Furthermore, for a M×N CAL 310, where $0 \leq i \leq M-1$ and $0 \leq j \leq N-1$, when the last column of a row i is reached, i.e., $C_{i,N-1}$, the next value is $C_{i+1,0}$, where $C_{i,N-1}<C_{i+1,0}$.

Each comparator 312 has a data input means 314 for receiving the input data signal. The input data signal 314 represents an input value which is received by each comparator 312 and is compared to the digital value stored within the comparator 312. Each comparator 312 generates a comparison signal 316 in response to the comparison of the input data value to the digital value stored in the comparator 312. An end cell $EC_{ij}$ 320 is associated with each comparator $C_{ij}$ 312, in each row. Each end cell $EC_{ij}$ 320 receives the comparison signal 316 from the comparator $C_{ij}$ 312 and the comparison signal 316 from an immediately adjacent comparator $C_{i(j-1)}$ 312. Each end cell $EC_{ij}$ 320 generates an output signal 322. The output signal 322 is supplied to a pull-down transistor 324 at the gate of the transistor 324. The pull-down transistor 324 has a source which is connected to ground potential and a drain which is connected to each column bit line.

Similarly, between each adjacent row of comparators 312 in the last column is an end cell $EC_{i,N-1}$ 321. The end cell $EC_{i,N-1}$ 321 receives the comparison signal 316 from the comparator $C_{i,N-1}$ 312 and the comparison signal 316 from the immediately adjacent comparator $C_{(i+1),N-1}$ 312 in the same column. The end cell 321 generates an output signal 323 which is supplied to the gate of a column pull-down transistor 325. The pull-down transistor 325 has a source connected to ground potential and a drain which is connected to each row bit line.

Each end cell $EC_{ij}$ of the row or the column type 320 is logically shown in FIG. 7 and is identical. Each end cell 320 comprises an AND gate, having two inputs: One input for receiving the comparison signal 316 from the comparator 312 associated with that end cell 320 and another input for receiving the comparison signal 316, after it has been inverted by an inverter from the immediately adjacent comparator 312. Logically, this is the same as a NOR gate with an inverted input.

The comparator 312, as previously stated, has a digital value stored therein. The digital value is represented in binary form. Thus, the comparator 312 comprises a plurality of interconnected bit comparators 326. One such bit comparator 326 is shown in FIG. 6a. Each of the bit comparators 326 is interconnected with the adjacent bit comparator 326. Each of the bit comparators 326 has a single bit value stored therein and compares a single bit of the input data signal 314 to the stored bit. Each of the bit comparators 326 has an input, shown as $C_{IN}$, for receiving the output of the comparison from the immediately adjacent bit comparator 326. The signal $C_{IN}$ is supplied to the source of a first transistor 328. The first transistor 328 has a gate which receives a single bit of the input data signal. The first transistor 328 also has a drain which is connected to the drain of a second transistor 330. The second transistor 330 has a source which is connected either to $V_{DD}$ or to ground, depending upon whether the stored value is a binary 1 (in which case it is connected to ground) or is a stored value of binary 0 (in which case the source is connected to $V_{DD}$). The second transistor 330 has a gate which also receives a single bit of the input data signal. The drain of the second transistor 330 and the drain of the first transistor 328 are connected together and form the output of the bit comparator 326, shown as $C_{OUT}$.

Thus, for bit $k$ programmed to be "1", the source of the second transistor 330 is connected to ground. $\bar{D}$ is supplied to the gate of the second transistor 330 and D is supplied to the gate of the first transistor 328. Conversely, if bit $k$ is programmed to be "0", the source of the second transistor 330 is connected to $V_{DD}$. D is supplied to the gate of the second transistor 330 and $\overline{D}$ is supplied to the gate of the first transistor 328. The net result is that at most two (2) transistors per bit is needed.

Referring to FIG. 6b, there is shown separately bit comparator 326 of FIG. 6a programmed to be "1" or "0". The embodiment of the bit comparator 326, shown in FIGS. 6a and 6b, is the preferred embodiment.

Referring to FIG. 6c, there is shown a variation of the bit comparator 326. In this embodiment, the comparator 326 comprises a dual bit comparator. Each of the four circuit shown in FIG. 6c is of the comparator 326 programmed to store the values of "00", or "01", or "10", or "11". The inputs $D_3$, $D_2$, $D_1$ and $D_0$ are decodes of two-bit input signals, and all four must be high during precharge. In the event speed is desired, this is the preferred embodiment due to fast propagation.

Referring to FIG. 6d, there is shown another variation of the bit comparator 326. In this embodiment, each of the cells of bit comparators is self-gated.

Finally, referring to FIG. 6e, there is shown yet another embodiment of a bit comparator 326. This bit comparator 326 is a dynamic carry chain, where $\overline{E}$ goes low during evaluation and $\overline{E}=\overline{D}=$high during precharge. This embodiment probably uses less semiconductor real estate than the self-gated embodiment or the preferred embodiment.

The logical equations for the comparator 312 associated with each end cell 320 is shown in FIG. 7. It is assumed that for the least significant bit, i.e., the rightmost bit of the bit comparator 326, that $C_{IN}$ is set at logical 0; that is, $C_{IN}$ is tied to ground potential. The calculation of $C_{OUT}$ depends upon the variables B and D, where B is the value of the stored bit within each bit comparator 326, and D is the value of the binary data in the input data signal.

Referring to FIG. 8, there is shown another embodiment of a bit comparator 426. A plurality of the interconnected bit comparators 426 is used to form the comparator 312. The bit comparator 426 differs from the bit comparator 326 in that the bit comparator 426 has a bit value which is changeable. The changeability of the bit stored in the binary comparator 426 occurs as follows. A separate latch or storage location 425 stores the value of the bit in the comparator 426. Changes in the bit value of the storage cell 425 changes the bit comparator 426. The storage location 425 can be a latch, flip/flop, static RAM, ROM or any other storage device.

FIG. 8a shows another programmable bit comparator 426. Each of the transistors in the bit comparator 426 has a floating gate 428. Programmability can be achieved by removing the floating gate 428 during the mask step and causing the transistor to be always on or off or switchable by the gate signal. Of course, the floating gate 428 can also be programmed in the field using well-known $E^2$ technology.

The Comparator Array Logic Circuit 210 or 310 has many uses. It has particular application in look-up functions where there is a monotonic function in which there are I bits input to 0 bits output with I greater than 0. The CAL finds applicability in monotonically increasing as well as monotonically decreasing functions. Some of the applications that can be found satisfying these criteria are logarithmic conversion, spell checking, data base operation, and high-speed network token pass identification.

While a traditional memory, such as a read-only memory ROM or a random access memory RAM can be used for this look-up function, the number of memory cells required would be orders of magnitude greater. For example, a ROM look-up table with I inputs and 0 output requires two to the I power times 0 bits, where I is greater than 0. A CAL circuit, on the other hand, requires only two to the 0 times I bits. For the case where I is equal to fifteen and 0 is equal to nine, a ROM would require two to the fifteen times nine or 294,912 memory cells. On the other hand, a CAL circuit would require two to the nine times fifteen or 7680 memory cells. Although a CAL circuit does require that at least two transistors be used per bit comparison (as shown in the embodiment in FIG. 6a for the bit comparator 326), this would mean that there would be a total requirement of 15,360 transistors required in the example shown above. In contrast, the same circuit using ROM implementation and, assuming only one transistor per bit, would require 294,912 transistors. Thus, there is a significant saving in transistors.

We claim:

1. A digital apparatus for converting a digital binary integer having a plurality of bits into logarithmic representation comprising:

means for determining the bit position of the leading non-zero bit of said integer;

means for shifting said integer such that the leading non-zero bit is the left most bit;

table means for receiving said shifted integer and for providing a number representative of the mantissa portion of the logarithm of said shifted number, said table means having a plurality of interconnected comparators, arranged in an array and for storing a plurality of digital values in a monotonically increasing or decreasing order; each comparator having means for receiving said shifted integer, means for comparing said shifted integer to the digital value stored in said comparator, means for generating a comparison signal in response to said comparison; means for receiving the comparison signal from an immediately adjacent comparator, means responsive to the comparison signal from each comparator and the comparison signal from the adjacent comparator for generating an output signal; means for receiving the plurality of output signals and for generating said number representative of the mantissa portion of the logarithm of said shifted number; and encoding means for receiving a point-set input value and the number of binary positions shifted by said shifting means and for generating the exponent portion of the logarithm of said integer, wherein said point-set input value is the scale value for said integer, whereby said mantissa portion and said exponent portion from the logarithmic representation of said integer.

* * * * *